United States Patent
Ohyama et al.

(10) Patent No.: US 11,322,221 B2
(45) Date of Patent: May 3, 2022

(54) MEMORY DEVICE WITH PIPELINED ACCESS

(71) Applicants: Sharp Semiconductor Innovation Corporation, Tenri (JP); TOHOKU UNIVERSITY, Sendai (JP)

(72) Inventors: Shigeo Ohyama, Fukuyama (JP); Tetsuo Endoh, Sendai (JP)

(73) Assignees: Sharp Semiconductor Innovation Corporation, Tenri (JP); TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 17/037,674

(22) Filed: Sep. 30, 2020

(65) Prior Publication Data

US 2022/0101939 A1 Mar. 31, 2022

(51) Int. Cl.
*G11C 29/42* (2006.01)
*G11C 29/44* (2006.01)
*G11C 7/06* (2006.01)
*G11C 7/10* (2006.01)

(52) U.S. Cl.
CPC .............. *G11C 29/42* (2013.01); *G11C 7/06* (2013.01); *G11C 7/1039* (2013.01); *G11C 7/1057* (2013.01); *G11C 7/1084* (2013.01); *G11C 29/44* (2013.01)

(58) Field of Classification Search
CPC ........... G11C 29/42; G11C 29/44; G11C 7/06; G11C 7/1039; G11C 7/1057; G11C 7/1084
USPC .................................................. 365/185.09
See application file for complete search history.

(56) References Cited

U.S. PATENT DOCUMENTS

| | | | |
|---|---|---|---|
| 6,704,230 B1 | 3/2004 | DeBrosse et al. | |
| 7,464,320 B2 * | 12/2008 | Nagai | G06F 11/1044 714/763 |
| 7,610,542 B2 * | 10/2009 | Nagai | G06F 11/1008 714/763 |
| 10,249,381 B2 * | 4/2019 | Shimizu | G11C 7/1006 |
| 10,447,316 B2 * | 10/2019 | Shang | G06F 11/1048 |
| 2009/0141544 A1 | 6/2009 | Sakimura et al. | |
| 2009/0319865 A1 | 12/2009 | Kanai et al. | |
| 2012/0311405 A1 | 12/2012 | Kanai et al. | |
| 2018/0261300 A1 | 9/2018 | Shimizu | |
| 2018/0276071 A1 | 9/2018 | Shimizu | |

FOREIGN PATENT DOCUMENTS

| | | |
|---|---|---|
| JP | 2006-527447 A | 11/2006 |
| JP | 2010-009102 A | 1/2010 |
| JP | 2018-152146 A | 9/2018 |
| JP | 2018-160166 A | 10/2018 |
| WO | 2007/046349 A1 | 4/2007 |

* cited by examiner

*Primary Examiner* — Son L Mai
(74) *Attorney, Agent, or Firm* — ScienBiziP, P.C.

(57) ABSTRACT

A memory device includes: a memory cell capable of holding data; and an ECC circuit capable of generating a correction code and detecting an error based on the correction code. The memory cell is accessed by a pipeline operation. The pipeline operation includes at least four pipeline stages including a read cycle reading data from the memory cell, an ECC cycle executing generation of the correction code or error detection for the memory cell in the ECC circuit, a wait cycle during which processing for data related to the memory cell is not executed, and a write cycle writing data into the memory cell.

20 Claims, 22 Drawing Sheets

Master Read Operation

Master Write Operation

Master Write Operation

MEMORY DEVICE WITH PIPELINED ACCESS

BACKGROUND

1. Field

The present disclosure relates to a memory device.

2. Description of the Related Art

Due to speeding up, improvement of reliability, and increase of complexity of information processing, performing error correction in the memory system has been demanded. In recent years, a resistance-change type memory that stores "0" data or "1" data depending on a difference in resistance value is expected as a next-generation memory. The resistance-change type memory includes magnetoresistive random access memory (MRAM), resistive random access memory (ReRAM), phase change RAM (PCM), and the like. They are different from each other in mechanism for changing the resistance value.

The MRAM has a magnetic tunnel junction (MTJ) as a constituent element. The MTJ has a configuration in which an insulating layer is provided between a fixed layer and a free layer. The MTJ stores data by a tunnel magnetoresistive effect in which magnitude of the resistance in a current path passing through the MTJ is different depending on two states, that is, whether a magnetization state of the free layer is parallel or antiparallel to a magnetization direction of the fixed layer. Rewriting of data is performed by a spin-transfer-torque (STT) method in which electron spin torque is applied to the free layer to cause magnetization reversal.

The ReRAM includes a metal oxide film sandwiched between electrodes. Then, by applying a voltage to this metal oxide film, metal ions are deposited as filaments, and a conduction path is generated in the oxide film. A resistance value of a memory cell differs depending on the presence or absence of the conduction path, and data is stored depending on the difference in the resistance value.

The PCM stores data by utilizing the difference in electric resistance value between a crystalline phase and an amorphous phase of a substance. In the PCM, a resistance change layer (for example, chalcogenide) can be rapidly heated and cooled to change the resistance change layer from a crystalline phase to an amorphous phase by making a current flow and can be returned from the amorphous phase to the crystalline phase by maintaining the crystallization temperature for a certain period of time.

In any memory, data is read by making the current flow and reading the resistance value of the memory cell. That is, a relatively large current is made to flow when rewriting data, and a relatively small current is made to flow when reading data. That is, precise control of voltage and current is important when rewriting and reading data. For that reason, a write error, a read error, or data corruption (read disturb) during reading may occur. Therefore, in order to improve operation reliability, the error correction code is preferably used.

The error correction code enables t-bit error correction by adding a k-bit code to m-bit data (where m, k, and t are natural numbers of 1 or more). A correction capability is defined as follows by the minimum Hamming distance dmin (the minimum value of the number of bits having different values in a code word of (m+k) bits).

$d_{min} \geq 2t+1$

Techniques related to the MRAM and error correction as described above are described in, for example, Japanese Patent Application Publication No. 2018-152146 and International Publication NO. WO2007/046349.

SUMMARY

According to an aspect of the disclosure, there is provided a memory device including a memory cell capable of holding data, and an ECC circuit capable of generating a correction code and detecting an error based on the correction code. The memory cell is accessed by a pipeline operation. The pipeline operation includes at least four pipeline stages including a read cycle reading data from the memory cell, an ECC cycle executing generation of the correction code or error detection for the memory cell in the ECC circuit, a wait cycle during which processing for data related to the memory cell is not executed, and a write cycle writing data into the memory cell.

DETAILED DESCRIPTION OF THE EMBODIMENTS

Hereinafter, embodiments of the present disclosure will be described with reference to the accompanying drawings. In the figures, the same or equivalent elements will be denoted by the same reference symbols, and redundant descriptions thereof will be omitted.

First Embodiment

A memory device according to a first embodiment of the present disclosure will be described.
<<Configuration>>

Figure 1:
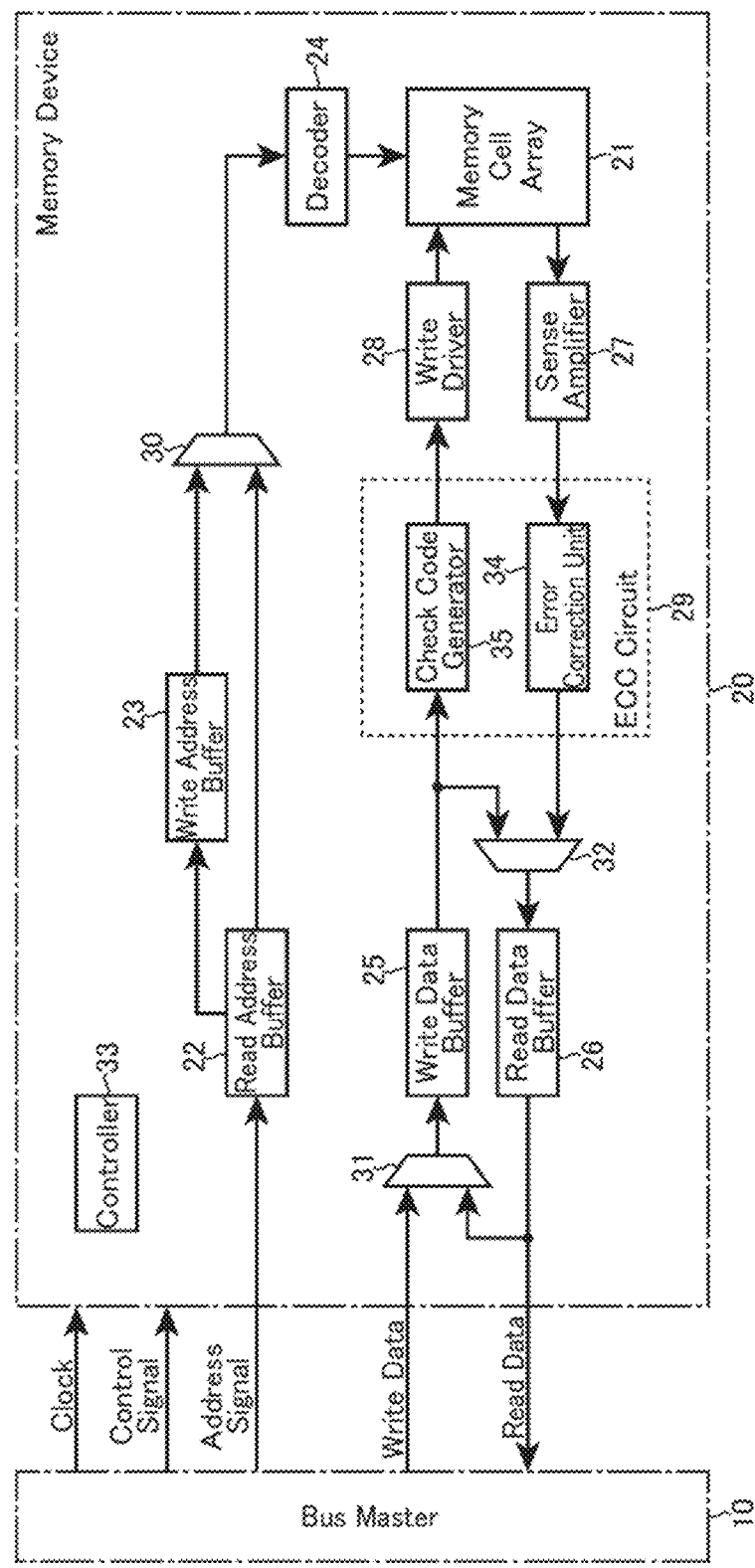
FIG. 1 is a block diagram of a processor system according to a first embodiment of the present disclosure.

First, a configuration of the memory device according to this embodiment will be described with reference to FIG. 1. FIG. 1 is a block diagram of, for example, a processor system 1 according to this embodiment.

As illustrated, the processor system 1 includes a bus master 10 and a memory device 20, both of which are communicably connected to each other via a bus. The bus master 10 is, for example, a processor such as a CPU or a DMA controller. The bus master 10 instructs the memory device 20 to write or read data. The memory device 20 is, for example, a resistance-change type non-volatile memory, and is an STT-MRAM in this example. The memory device 20 functions as a cache memory or a main memory of the processor, for example.

The bus master 10 transmits a clock and a control signal to the memory device 20, and also transmits write data into the memory device 20 during writing. The memory device 20 operates according to a signal received from the bus master 10, stores received write data during writing, and transfers data read from a designated address to the bus master 10 during reading.

Next, details of the configuration of the memory device 20 will be described. As illustrated in FIG. 1, the memory device 20 includes a memory cell array 21, a read address buffer 22, a write address buffer 23, a decoder (row decoder and column decoder) 24, a write data buffer 25, a read data buffer 26, a sense amplifier 27, and a write driver 28, an error checking and correcting (ECC) circuit 29, selectors 30, 31, and 32, and a controller 33 are provided.

The memory cell array 21 includes a plurality of memory cells. The memory cells are arranged in a matrix and associated with rows and columns. The memory cells store data in a non-volatile manner. Details of the configuration of the memory cell array 21 will be described later with reference to FIG. 2.

The read address buffer 22 holds an address (row address and column address) of the memory cell array 21 received from the bus master 10 during the data read operation and the data write operation. The write address buffer 23 receives an address from the read address buffer 22 and holds the address. Hereinafter, the read address buffer 22 and the write address buffer 23 may be simply referred to as the address buffer 22 and the address buffer 23, respectively.

The selector 30 selects an address held by either the address buffer 22 or 23 based on, for example, an instruction from the controller 33. Then, the selector 30 transfers the selected address to the decoder 24.

The decoder 24 decodes a row address and a column address received from the selector 30. Then, the decoder 24 selects a row direction and a column direction in the memory cell array 21 based on the decoding result. With this configuration, the memory cell which is a read target or a write target is selected. In the following, of the decoder 24, a unit that selects the row direction is referred to as a row decoder 24A, and a unit that selects the column direction is referred to as a column decoder 24B.

The sense amplifier 27 reads data from a selected memory cell, senses and amplifies the read data.

The write driver 28 applies a voltage or supplies a current to the selected memory cell based on the write data. With this configuration, data is written into the selected memory cell.

The ECC circuit 29 executes ECC processing on read data and write data. The ECC circuit 29 includes an error correction circuit 34 and a check code generator 35. The check code generator 35 generates a redundant bit (for example, parity) based on the write data when writing the data. Then, the generated parity is added to the write data, and this write data with parity is transferred to the write driver 28. The error correction circuit 34 also receives read data from the sense amplifier 27. Then, the error correction circuit 34 generates a syndrome based on the received read data and detects an error. Then, when an error is detected, the error correction circuit 34 corrects the error.

The write data buffer 25 holds the write data into the memory cell. The read data buffer 26 holds the data read from the memory cell. Hereinafter, the write data buffer 25 and the read data buffer 26 may be simply referred to as the data buffer 25 and the data buffer 26, respectively.

The selector 32 selects either an output of the error correction circuit 34 of the ECC circuit 29 or data held in the write data buffer 25 based on, for example, the instruction of the controller 33. Then, the selector 32 transfers the selected data to the read data buffer 26.

The selector 31 selects either the write data received from the bus master 10 or the data held in the read data buffer 26 based on, for example, an instruction of the controller 33. Then, the selector 31 transfers the selected data to the write data buffer 25.

The controller 33 controls an operation of the entire memory device 20. The controller 33 operates in synchronization with the clock received from the bus master 10, for example. Then, the controller 33 controls the operations of the selectors 30, 31, and 32 as described above. The controller 33 executes a data write operation and a data read operation in the memory device 20 by a pipeline operation. Details of this operation will be described later with reference to FIG. 4A and subsequent figures.

Figure 2:
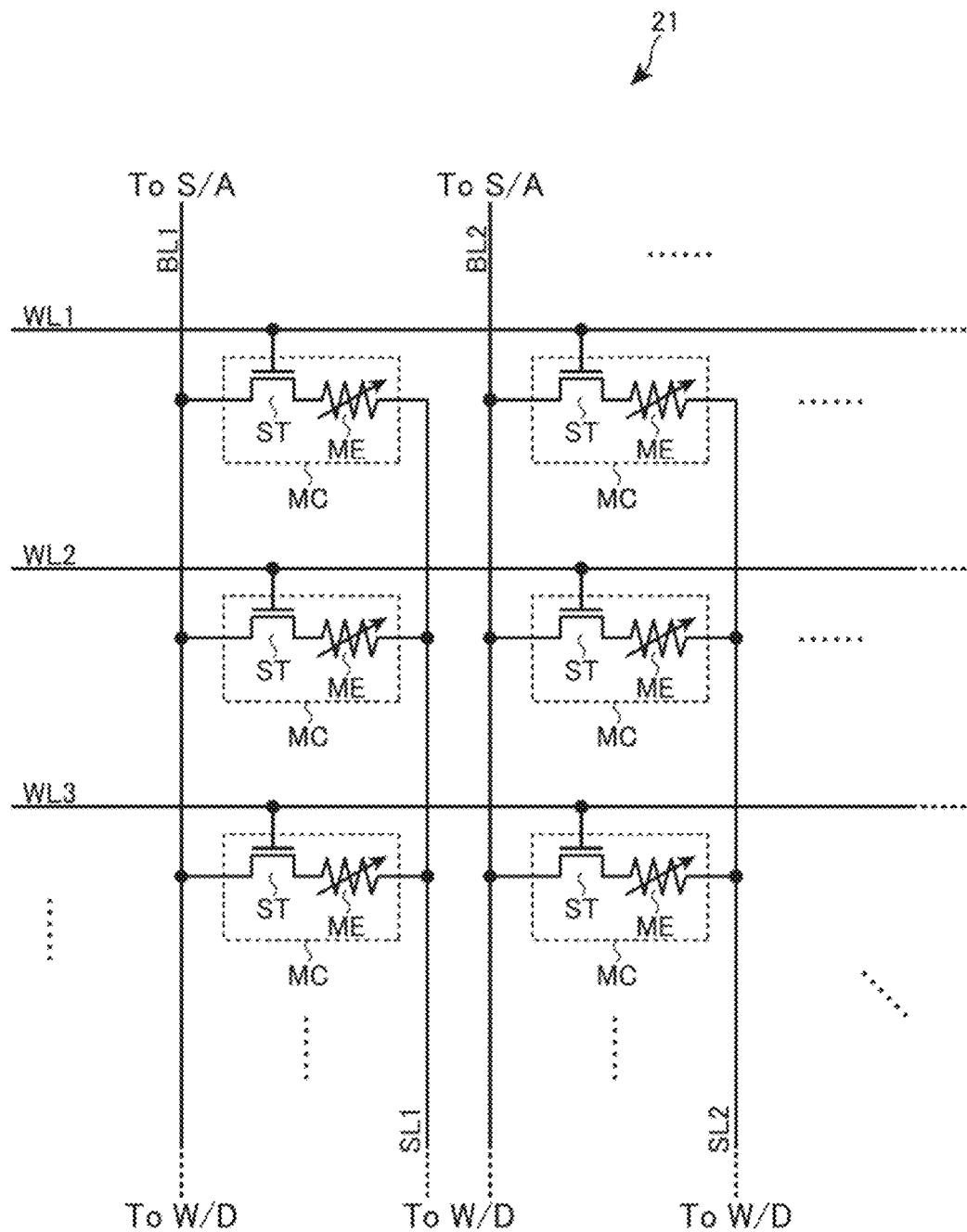
FIG. 2 is a circuit diagram of a memory cell array according to the first embodiment of the present disclosure.

FIG. 2 is a circuit diagram of a partial region of a circuit diagram of the memory cell array 21 according to this embodiment. As illustrated, the memory cell array 21 includes a plurality of memory cells MC arranged in a matrix. Each memory cell MC includes a select transistor ST and a memory element ME. The select transistor ST is, for example, a MOS transistor. The memory element ME is a variable resistance element, and is an MTJ element in this example. Then, a source of the select transistor ST is connected to one end of the memory element ME.

In the memory cell array 21, gates of the select transistors ST of the memory cells MC in the same row are commonly connected to the same word line WLj (j is a natural number from 1 to N, N is a natural number of 2 or more). Drains of the select transistors ST of the memory cells MC in the same column are commonly connected to the same bit line BLk (k is a natural number from 1 to M, and M is a natural number of 2 or more). Furthermore, the other ends of the memory elements ME of the memory cells MC in the same column are commonly connected to the same source line SLk.

In the configuration described above, one of the word lines WL is selected by the row decoder 24A during the data write operation and the data read operation. A voltage is applied to the selected word line WL by the row decoder 24A, and the select transistors ST connected to the selected word line WL are turned ON.

During the data write operation and the data read operation, either bit line BL or source line SL is selected by a column selector (not illustrated). The selection operation by the column selector is based on the decoding result in the column decoder 24B. Then, when reading data from the memory cell MC, the selected bit line BL is connected to the sense amplifier (S/A) 27, and the selected source line SL is grounded. When writing data into the memory cell MC, the selected bit line BL and source line SL are connected to the write driver (W/D) 28.

Figure 3A:
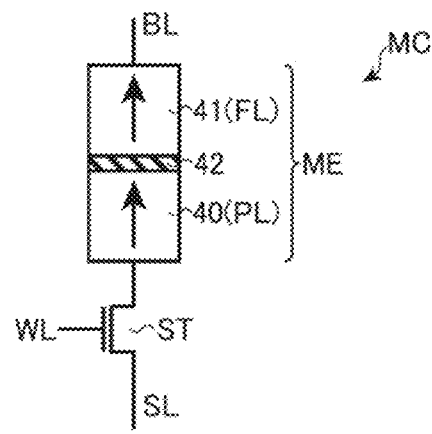
FIG. 3A is a schematic diagram of a memory cell according to the first embodiment of the present disclosure.
Figure 3B:
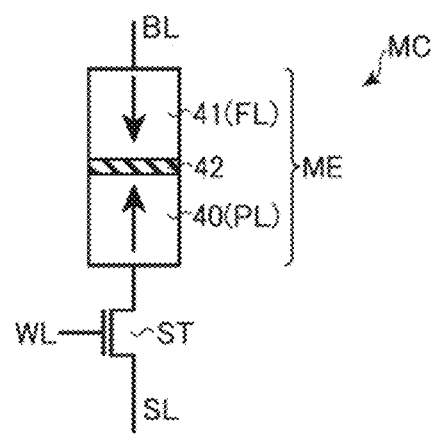
FIG. 3B is another schematic diagram of the memory cell according to the first embodiment of the present disclosure.

FIG. 3A and FIG. 3B are schematic diagrams of the memory cell MC, and particularly focus on the configuration of the MTJ element. As illustrated, the MTJ element includes two ferromagnetic films 40 and 41 and a tunnel insulating film 42 between the two ferromagnetic films. The ferromagnetic film 40 is a fixed layer (also referred to as a reference layer) whose magnetization direction is fixed. On the other hand, the ferromagnetic film 41 is a free layer (also referred to as a storage layer) whose magnetization direction can be changed by a current. In this example, the fixed layer 40 is connected to the source of the select transistor ST and the free layer 41 is connected to the bit line BL.

The MTJ element can take two states as illustrated in FIGS. 3A and 3B. In the figure, the arrows represented on the ferromagnetic films 40 and 41 indicate the directions of magnetization. In the example of FIG. 3A, the magnetization direction of the fixed layer 40 and the magnetization direction of the free layer 41 are parallel. As such, when the magnetization directions of the two layers are in a parallel state, the electric resistance value between the bit line BL and the source line SL is small. In contrast, in the example of FIG. 3B, the magnetization direction of the fixed layer 40 and the magnetization direction of the free layer 41 are opposite each other. In this way, when the magnetization directions of the two layers are in an antiparallel state, the electric resistance value between the bit line BL and the source line SL is large. The MTJ element holds "0" data and "1" data by utilizing this change in resistance value.

Rewriting of data is performed by supplying a current to the MTJ element. For example, by making a constant current flow from the bit line BL to the source line SL, the MTJ element is brought into a parallel state. On the contrary, the MTJ element is brought into an antiparallel state by making a constant current flow from the source line SL to the bit line BL. Then, the current is supplied to the MTJ element by the write driver 28, and the direction of the current made to flow by the write driver 28 is determined based on the write data.

Reading of data is performed by detecting whether or not the current flows through the bit line BL. That is, when the MTJ elements are in the parallel state, the current flows from the bit line BL to the source line SL via the memory cell MC. On the other hand, when the MTJ elements are in the antiparallel state, almost no current flows. The sense amplifier 27 senses and amplifies this difference in current.

In the examples of FIGS. 3A and 3B, the fixed layer 40 is provided on the source line SL side and the free layer 41 is provided on the bit line BL side. However, the free layer 41 may be provided on the source line SL side and the fixed layer 40 may be provided on the bit line BL side.

<<Operation>>

Next, the operation of the memory device 20 according to this embodiment will be described. The operation of the memory device 20 corresponding to a write command from the bus master 10 according to this embodiment includes reading of data from the memory cell MC as well as writing of data to the memory cell MC. Similarly, the operation of the memory device 20 corresponding to a read command from the bus master 10 also includes writing of data to the memory cell MC as well as reading of data from the memory cell MC.

Accordingly, in the following, a series of processing performed in response to the write command and the read command received from the bus master 10 are referred to as a master write operation and a master read operation, respectively. With this configuration, the master read operation and the master write operation are distinguished from the read operation for reading data from the memory cell MC and the write operation for writing data to the memory cell MC, respectively.

Figure 4A:
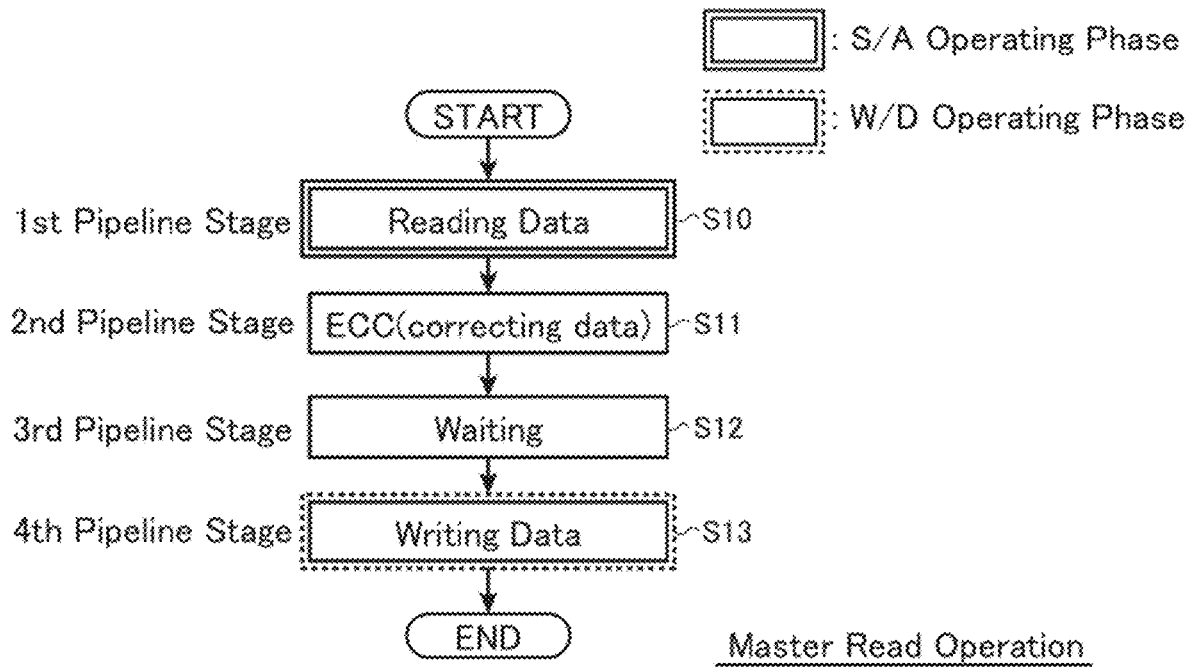
FIG. 4A is a flowchart of a master read operation according to the first embodiment of the present disclosure.

First, the master read operation will be described with reference to FIG. 4A. FIG. 4A is a flowchart illustrating a flow of the master read operation according to this embodiment. In FIG. 4A, the step described by double-solid lined frame is a phase in which the sense amplifier 27 operates.

The step described by the broken and solid lined frames is a phase in which the write driver 28 operates.

As illustrated, the master read operation includes four pipeline stages. The four pipeline stages include a first pipeline stage in which a read cycle is executed, a second pipeline stage in which an ECC cycle is executed, a third pipeline stage in which a wait cycle is executed, and a fourth pipeline stage in which a write cycle is executed.

First, the memory device 20 that receives the master read command from the bus master 10 executes the read cycle in the first pipeline stage. That is, data is read from the memory cell MC corresponding to the address designated by the bus master 10 (step S10). Specifically, the address transmitted from the bus master 10 is held in the address buffer 22, and the selector 30 selects the address held in the address buffer 22 and transfers the address to the decoder 24. The row decoder 24A selects any word line WL, and the column decoder 24B selects any bit line BL and source line SL. Then, the selected bit line BL is charged and the source line SL is grounded. As a result, the sense amplifier 27 senses the current flowing through the selected bit line BL. For example, the sense amplifier 27 determines whether the data held in the selected memory cell MC is "0" or "1" depending on whether the resistance value of the selected memory cell MC is larger or smaller than the reference value, based on the current flowing through the selected bit line BL.

Next, the memory device 20 executes the ECC cycle in the second pipeline stage. That is, the error correction circuit 34 determines whether or not there is an error in the data read in step S10, and corrects an error when the error is detected (step S11). The selector 32 selects the error correction circuit 34, and the data of which error is corrected is transferred to the data buffer 26. Then, when the second pipeline stage ends, the data is output from the data buffer 26 to the bus master 10 as read data from the memory device 20. In the second pipeline stage, the data held in the data buffer 26 is transferred to the check code generator 35 via the selector 31 and the data buffer 25. Then, the check code generator 35 generates redundant data (parity) based on the transferred data.

Next, the memory device 20 executes the wait cycle in the third pipeline stage (step S12). That is, at least the decoder 24, the sense amplifier 27, the write driver 28, and the ECC circuit 29 do not execute the operation related to the master read operation. More specifically, based on the master read command, the sense amplifier 27 does not perform the sensing operation, the write driver 28 does not apply a voltage to the bit line BL and the source line SL, and the ECC circuit 29 does not perform ECC processing.

Next, the memory device 20 executes the write cycle in the fourth pipeline stage. That is, a data write operation (write-back operation) is executed (step S13). In step S13, the selector 30 selects the address transferred from the address buffer 22 to the address buffer 23. Then, based on this address, the decoder 24 selects any word line WL, bit line BL, and source line SL. Then, the write driver 28 supplies a current to the selected memory cell MC in the direction from the bit line BL to the source line SL or in the opposite direction, based on the data transferred from the check code generator 35. That is, when an error is found in the read data in step S11, the data held in the corresponding memory cell MC is not left as it is, but the data corrected in step S11 is written back to the memory cell MC. This is processing of step S13.

Figure 4B:
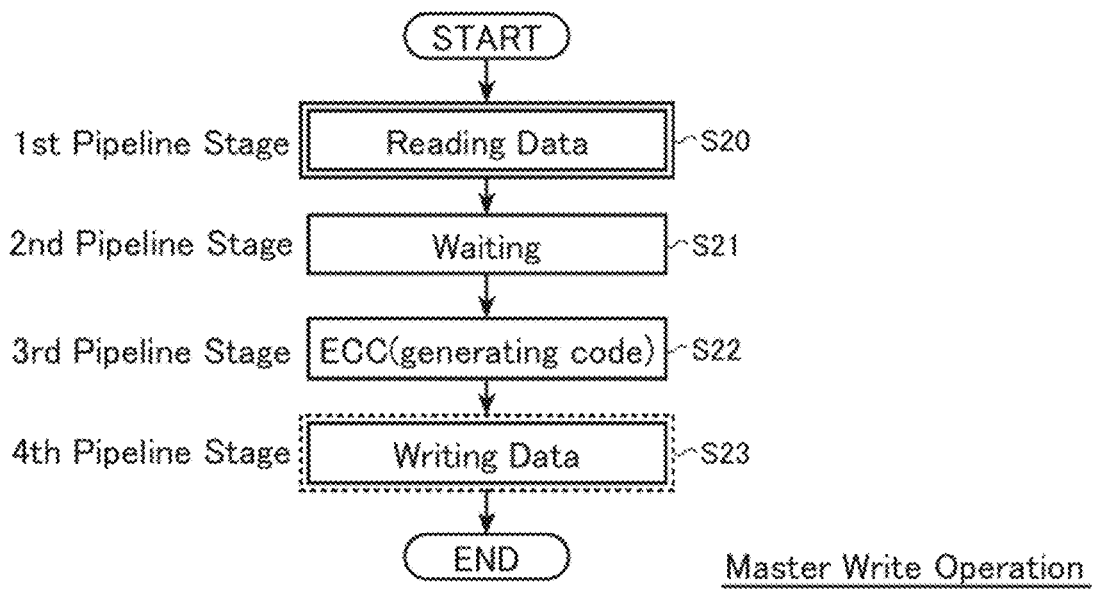
FIG. 4B is a flowchart of a master write operation according to the first embodiment of the present disclosure.

Next, the master write operation will be described with reference to FIG. 4B. FIG. 4B is a flowchart illustrating a flow of the master write operation according to this embodiment.

As illustrated, the master write operation includes four pipeline stages. The four pipeline stages include a first pipeline stage in which a read cycle is executed, a second pipeline stage in which a wait cycle is executed, a third pipeline stage in which an ECC cycle is executed, and a fourth pipeline stage in which a write cycle is executed.

First, the memory device 20 that receives the master write command from the bas master 10 executes the read cycle in the first pipeline stage. That is, data is read from the memory cell MC corresponding to the address designated by the bus master 10 (step S20). This operation is the same as step S10 in the master read operation. However, in step S20, this operation is executed up to error correction in the error correction circuit 34.

Next, the memory device 20 executes the wait cycle in the second pipeline stage (step S21). That is, at least the decoder 24, the sense amplifier 27, the write driver 28, and the ECC circuit 29 do not execute the operation related to the master write operation. More specifically, based on the master write command, the sense amplifier 27 does not perform the sense operation, the write driver 28 does not apply a voltage to the bit line BL and the source line SL, and the ECC circuit 29 does not perform ECC processing.

Next, the memory device 20 executes the ECC cycle in the third pipeline stage. That is, the ECC processing is executed (step S22). In the third pipeline stage, the data of which error is corrected in step S20 is transferred to the data buffer 25 via the selectors 32 and 31 and the data buffer 26. Furthermore, the write data received from the bus master 10 is transferred to the data buffer 25 via the selector 31. Then, in the data buffer 25, the data from the data buffer 26 and the data from the bus master 10 are combined to generate write data. This operation is to complement missing bits with the data obtained from the data buffer 26 when the data supplied from the bus master 10 is smaller than the number of bits demanded to generate the parity. This point will be described in the fourth embodiment. Subsequently, the obtained write data is transferred to the check code generator 35, and the check code generator 35 generates the parity.

Then, the memory device 20 executes the write cycle in the fourth pipeline stage. That is, the data write operation is executed (step S23). That is, a bit string of write data, which is a predetermined write unit, and a parity are written into the memory cells MC connected to the selected word line WL and the selected bit line BL.

Figure 4C:
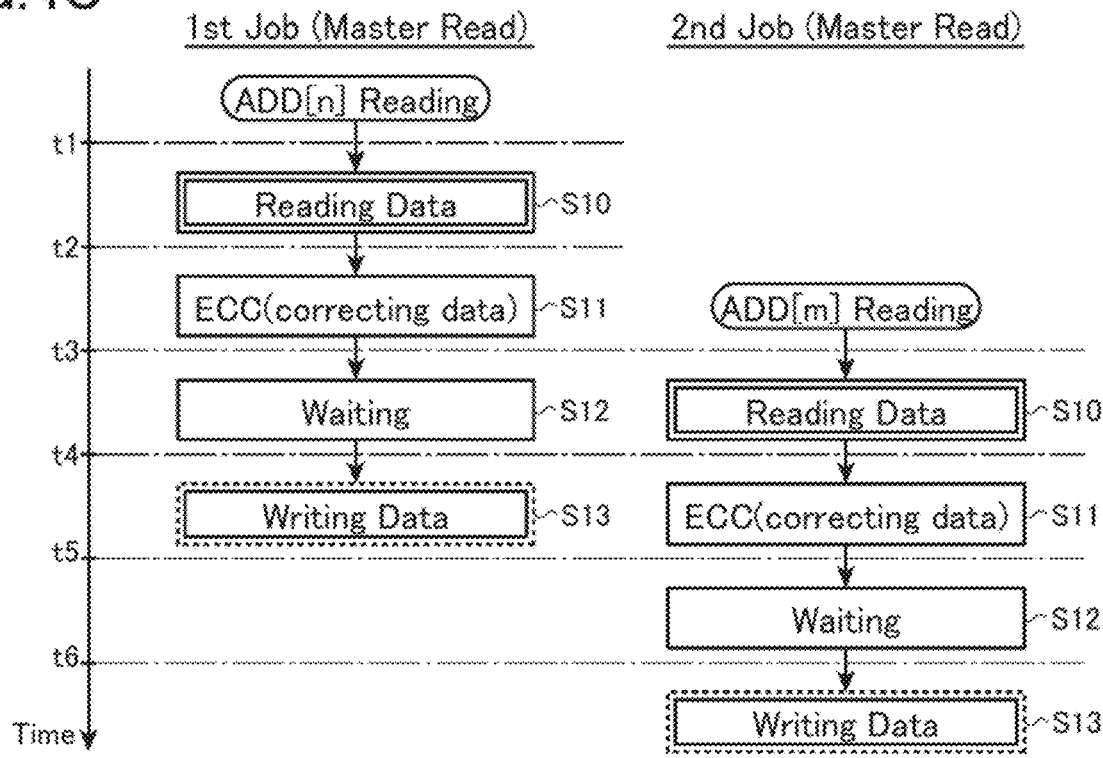
FIG. 4C is another flowchart of the master read operation according to the first embodiment of the present disclosure.
Figure 4D:
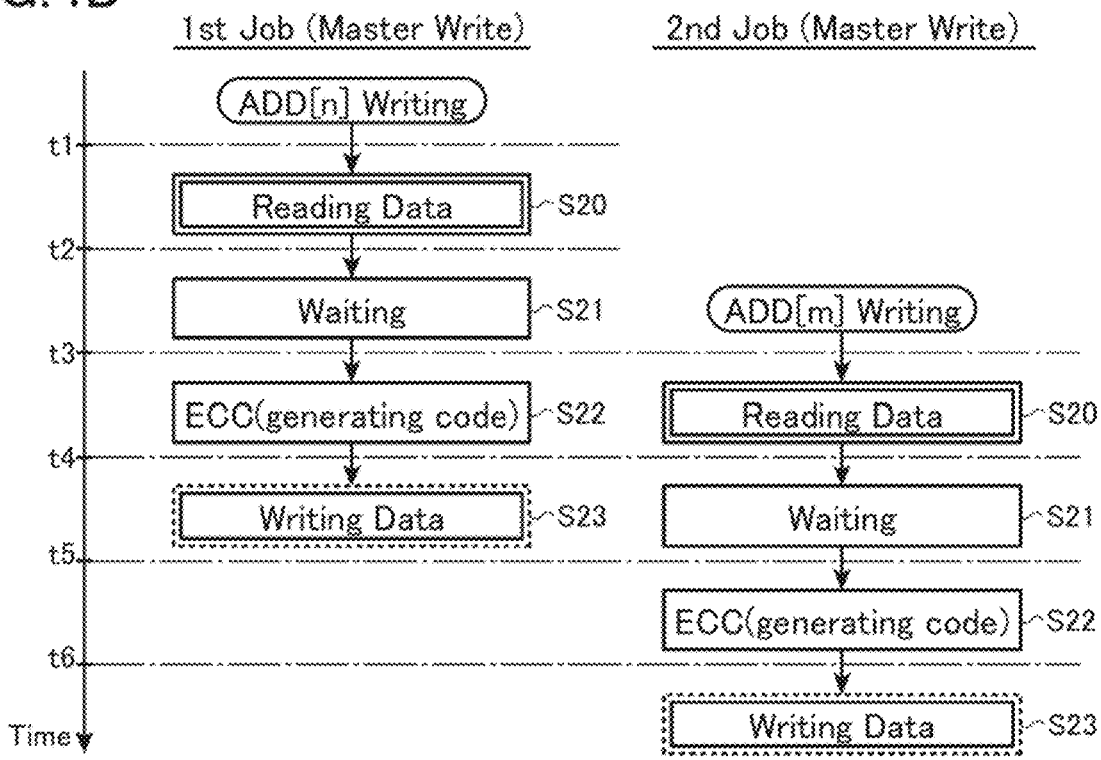
FIG. 4D is another flowchart of the master write operation according to the first embodiment of the present disclosure.
Figure 4E:
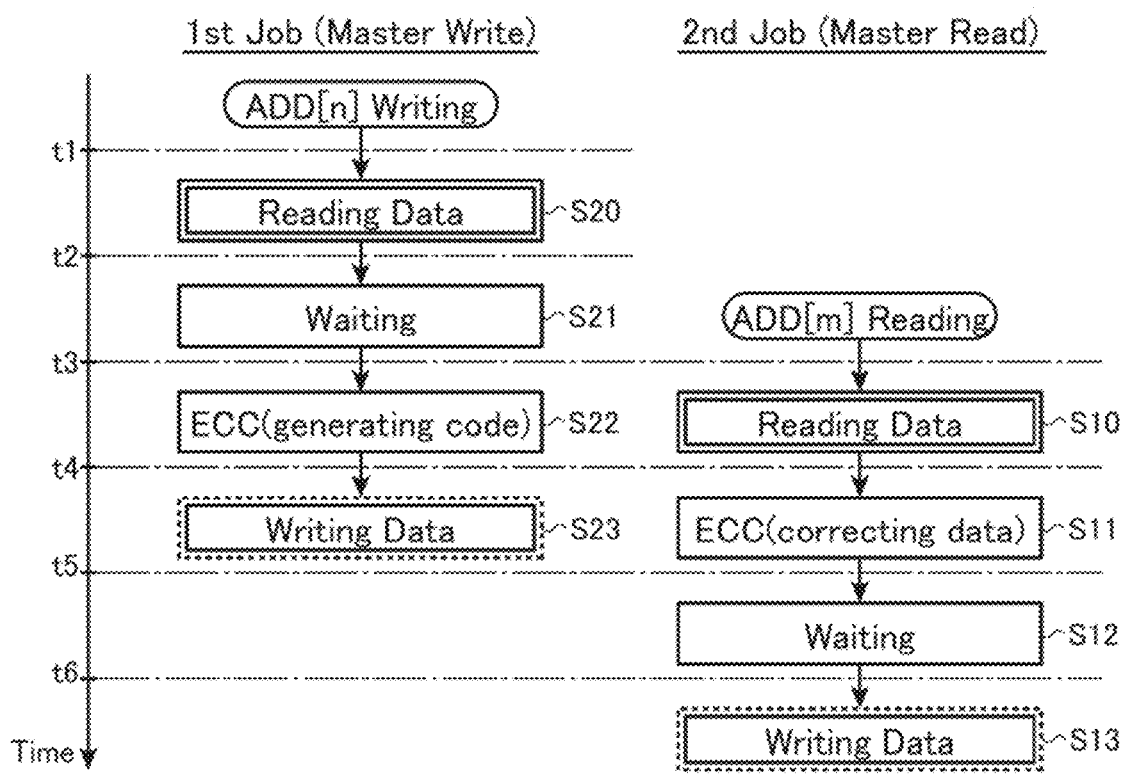
FIG. 4E is a flowchart of a master write operation and a master read operation according to the first embodiment of the present disclosure.

Next, the pipeline operation of the memory device 20 when the bus master 10 consecutively issues a master read command and/or a master write command will be described with reference to FIGS. 4C, 4D, and 4E. FIGS. 4C, 4D, and 4E are flowcharts which respectively illustrate a case where master read commands are issued consecutively, a case where master write commands are issued consecutively, and a master write command and a master read command are issued consecutively.

First, the case where the master read commands are issued consecutively will be described with reference to FIG. 4C. As illustrated, it is assumed that the bus master 10 first issues a first master read command for an address ADD[n] and then issues a second master read command for an address ADD[m] (each of n and m is a natural number of 1 or more). Then, the memory device 20 executes the first pipeline stage corresponding to the first master read command during the period from time t1 to t2, and reads data from the memory cell MC.

Subsequently, the memory device 20 executes the second pipeline stage corresponding to the first master read command during the period from time t2 to t3, and performs error correction and parity generation.

Next, during the period from time t3 to t4, the memory device 20 executes the third pipeline stage corresponding to the first master read command. That is, access to the memory cell array 21 related to the first master read command is prohibited. In parallel with this, the memory device 20 executes the first pipeline stage corresponding to the second master read command. In a time period from time t3 to t4, the wait cycle is executed for the first master read command, but the read cycle is executed for the second master read command. Accordingly, the processing unit (decoder 24 or sense amplifier 27) related to the read operation does not perform processing corresponding to the first master read command, but performs the processing related to the data read corresponding to the second master read command.

Next, during the period from time t4 to t5, the memory device 20 executes the fourth pipeline stage corresponding to the first master read command. That is, the memory device 20 writes the data, of which the error is corrected and to which the parity is added, into the memory cell MC based on the first master read command. In parallel with this, the memory device 20 executes the second pipeline stage corresponding to the second master read command.

After that, the memory device 20 executes the third pipeline stage corresponding to the second master read command during the period from time t5 to t6, and executes the fourth pipeline stage corresponding to the second master read command during a period starting from time t6.

In this way, in two consecutive pipeline operations, four phases of two phases (from time t1 to t2 and from time t3 to t4) in which the sense amplifier 27 operates and two phases (from time t4 to t5 and time starting from time t6) in which the write driver 28 operates do not overlap in time. Accordingly, bus contention can be avoided.

Next, the case where master write commands are issued consecutively will be explained with reference to FIG. 4D. As illustrated, it is assumed that the bus master 10 first issues a first master write command for the address ADD[n] and then issues a second master write command for the address ADD[m]. Then, during the period from time t1 to t2, the memory device 20 executes the first pipeline stage corresponding to the first master write command and reads the data from the memory cell MC.

Subsequently, during the period from time t2 to t3, the memory device 20 executes the second pipeline stage corresponding to the first master write command. That is, access to the memory cell array 21 related to the first master write command is prohibited.

Next, during the period from time t3 to t4, the memory device 20 executes the third pipeline stage corresponding to the first master write command. That is, the memory device generates write data based on the data received from the bus master 10 and the data received from the data buffer 26, and further generates the parity. In parallel with this, the memory device 20 executes the first pipeline stage corresponding to the second master write command.

Next, during the period from time t4 to t5, the memory device 20 executes the fourth pipeline stage corresponding to the first master write command. That is, the memory device 20 writes the data, of which the error is corrected and to which the parity is added, into the memory cell MC based on the first master write command. In parallel with this, the memory device 20 executes the second pipeline stage corresponding to the second master write command. In a time period from time t4 to t5, the wait cycle is executed for the second master write command, but the write cycle is executed for the first master write command. Therefore, the processing unit (decoder 24 or write driver 28) related to the write operation does not perform processing corresponding to the second master write command, but performs processing related to data write corresponding to the first master write command.

After that, the memory device 20 executes the third pipeline stage corresponding to the second master write command during the period from time t5 to t6, and executes the fourth pipeline stage corresponding to the second master write command during the period starting from time t6.

In this example as well, in two consecutive pipeline operations, four phases of two phases (from time t1 to t2 and from time t3 to t4) in which the sense amplifier 27 operates and two phases (from time t4 to t5 and time starting from time t6) in which the write driver 28 operates do not overlap in time.

Next, a case where the master write command is first issued and the master read command is successively issued will be described with reference to FIG. 4E. As illustrated, it is assumed that the bus master 10 first issues a master write command for an address ADD[n], and then issues a master read command for an address ADD[m]. Even in this case, the operation phases of the sense amplifier 27 are the period from time t1 to t2 and the period from time t3 to t4, and the operation phases of the write driver 28 are the period from time t4 to t5 and the period starting from time t6. Therefore, overlapping of these four phases is suppressed.

Figure 5:
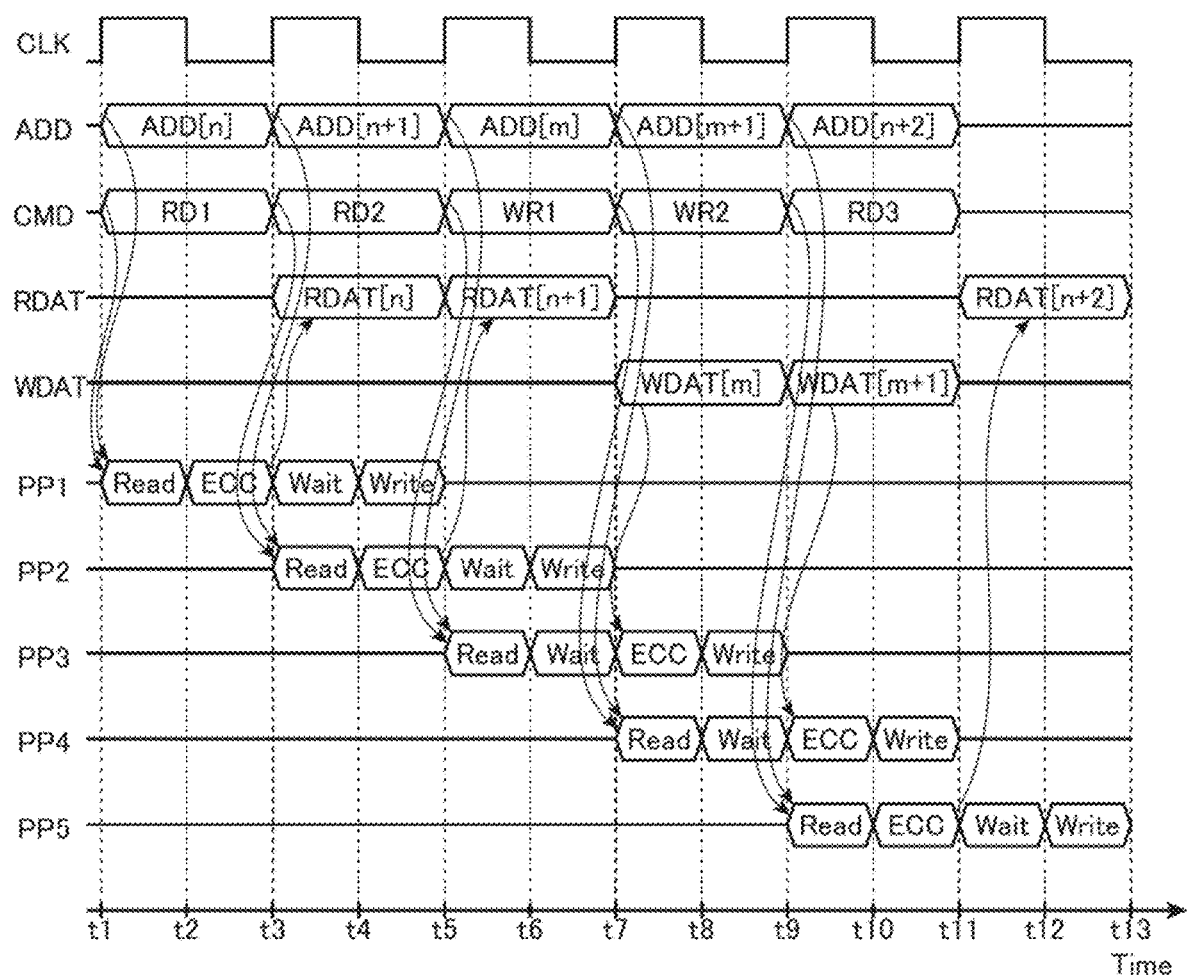
FIG. 5 is a timing chart of various signals when a memory device according to the first embodiment of the present disclosure is accessed.

FIG. 5 is a timing chart illustrating a clock CLK, an address ADD, a command CMD, read data RDAT, and write data WDAT that are transmitted and received between the bus master 10 and the memory device 20, and states of five pipelines PP1 to PP5 executed in the memory device 20. In FIG. 5, a case where the bus master 10 sequentially issues a first master read command RD1, a second master read command RD2, a first master write command WR1, a second master write command WR2, and a third master read command RD3 is illustrated.

As illustrated, at time t1, the bus master 10 issues a read target address ADD[n] together with the master read command RD1. Then, at time t1, the memory device 20 executes the first pipeline operation PP1 in response to the master read command RD1 corresponding to the address ADD[n]. At time t3, when ECC processing ends, data in the data buffer 26 is output to the bus master 10 as read data RDAT[n] from the memory device 20.

Subsequently, at time t3, the bus master 10 issues the read target address ADD[n+1] together with the master read command RD2. Then, at time t3, the memory device 20 executes the second pipeline operation PP2 in response to the master read command RD2 corresponding to the address ADD[n+1]. At time t5, when ECC processing ends, the data in the data buffer 26 is output to the bus master 10 as the read data RDAT[n+1] from the memory device 20.

Furthermore, at time t5, the bus master 10 issues a write target address ADD[m] together with the master write command WR1. Then, at time t5, the memory device 20 executes the third pipeline operation PP3 in response to the master write command WR1 corresponding to the address ADD[m]. Then, at time t7, when the write data WDAT[m] is received from the bus master 10, ECC processing is performed, and the data is written into the memory cell MC during the period from time t8 to time t9. The same applies thereafter.

<<Effects of this Embodiment>>

As described above, the memory device according to this embodiment can improve operation reliability. This effect will be described below.

According to the memory device according to this embodiment, four stages and four types of pipelines including the read cycle S10, the ECC cycle S11, the wait cycle S12, and the write cycle S13 respond to a read request from the bus master 10. Similarly, four stages and four types of pipelines including the read cycle S20, the wait cycle S21, the ECC cycle S22, and the write cycle S23 respond to a write request from the bus master 10.

Accordingly, the data write-back cycle (write cycle S13) caused by the error correction during reading can be executed in parallel with any processing stage of the next pipeline operation, and is invisible to the bus master 10. That is, the bus master 10 can issue the next command without waiting for data write-back processing.

Accordingly, the operation speed of the memory device 20 can be improved. In this case, by providing the wait cycles S12 and S21, contention between a bus between the bus master 10 and the memory device 20 and a bus inside the memory device 20 can be suppressed. As a result, when viewed from the bus master 10, generation of random weights can be suppressed. In addition, the demanded number of cycles (the number of pipeline stages) can be made the same between the master read operation and the master write operation, and it is possible to realize a very suitable operation for a one-chip microcomputer or the like that demands a constant operation cycle. In this respect, the MRAM, which is a non-volatile memory and can operate at high speed, may be used as a cache memory of the processor. Then, by applying this embodiment to the MRAM for such an application, the operation reliability of the processor can be improved. Furthermore, in the MRAM, it is important to ensure a sufficient difference between the resistance value of the memory cell holding "0" data and the resistance value of the memory cell holding "1" data. This is because by increasing this difference, data read reliability can be improved. However, it may be difficult to increase the difference between the resistance values. Then, the difference between a read current when reading "0" data and a read current when reading "1" data becomes relatively small, and the possibility of erroneous reading may increase. In addition, when the writing time is shortened for high-speed operation, the possibility of erroneous writing may increase. Accordingly, by using the correction code as in this embodiment, the operation reliability of the MRAM can be dramatically improved.

Also, by preparing the address buffer and data buffer for reading and writing, another operation cycle (for example, ECC cycle or wait cycle) can be inserted between the read cycle and the write cycle, and as a result, the four pipeline stages described above can be realized.

Furthermore, in these four pipeline stages, the sense amplifier 27 operates in the first half (steps S10 and S20), and the write driver 28 operates in the second half (steps S13 and S23), and thus the four pipeline stages can be executed without interruption.

Second Embodiment

Next, a memory device according to the second embodiment of the present disclosure will be described. In this embodiment, in the master read operation described in the first embodiment, of the bit string of the data read from the memory cell array 21, only the bit having the bit error is written back to the memory cell MC. Only the points different from the first embodiment will be described below.

<<Configuration>>

Figure 6:
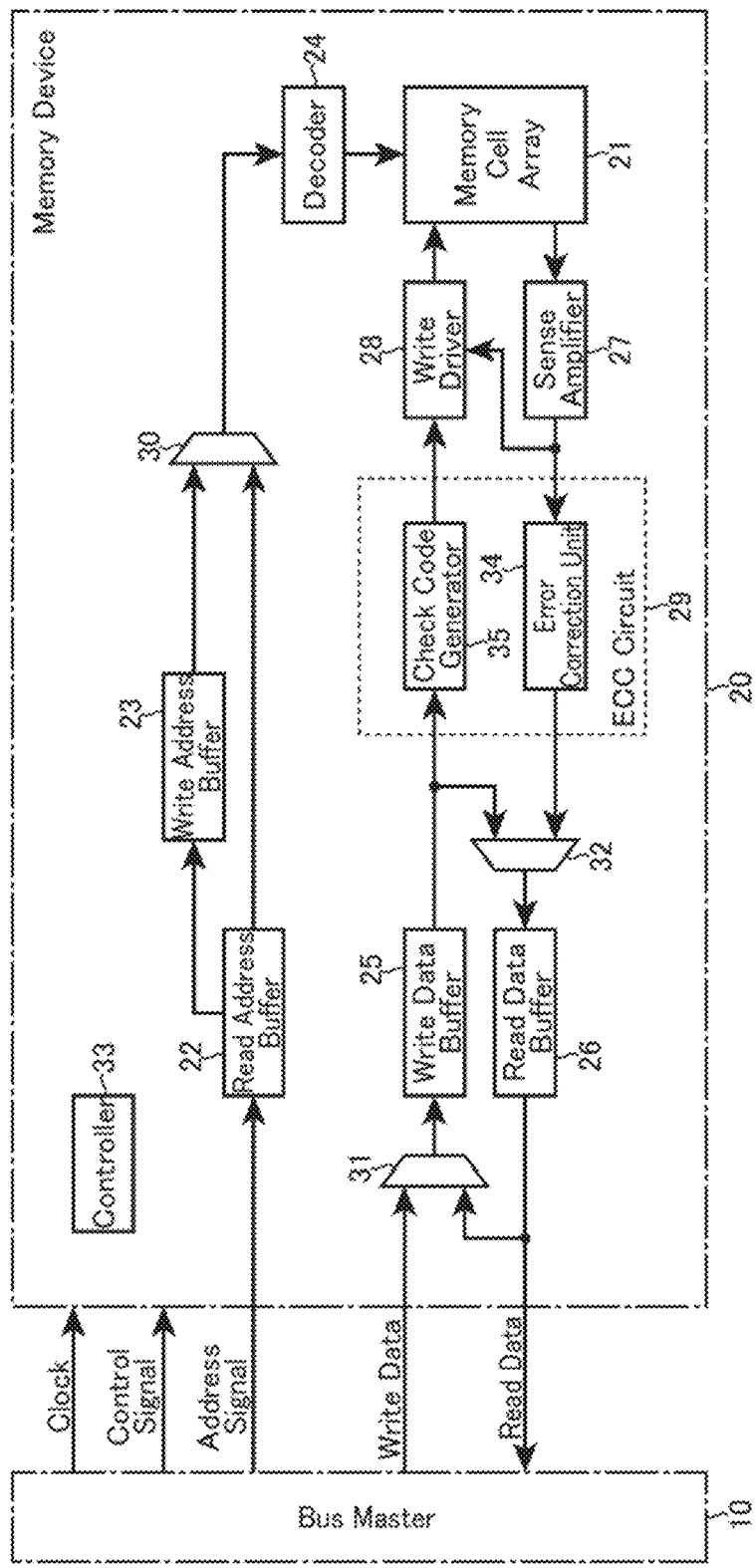
FIG. 6 is a block diagram of a processor system according to a second embodiment of the present disclosure.

FIG. 6 is a block diagram of the processor system 1 according to this embodiment. As illustrated, the memory device 20 according to this embodiment further includes a bypass path for transferring the data read by the sense amplifier 27 to the write driver 28 in FIG. 1 described in the first embodiment. Other configurations are similar to those of the first embodiment.

<<Operation>>

Figure 7:
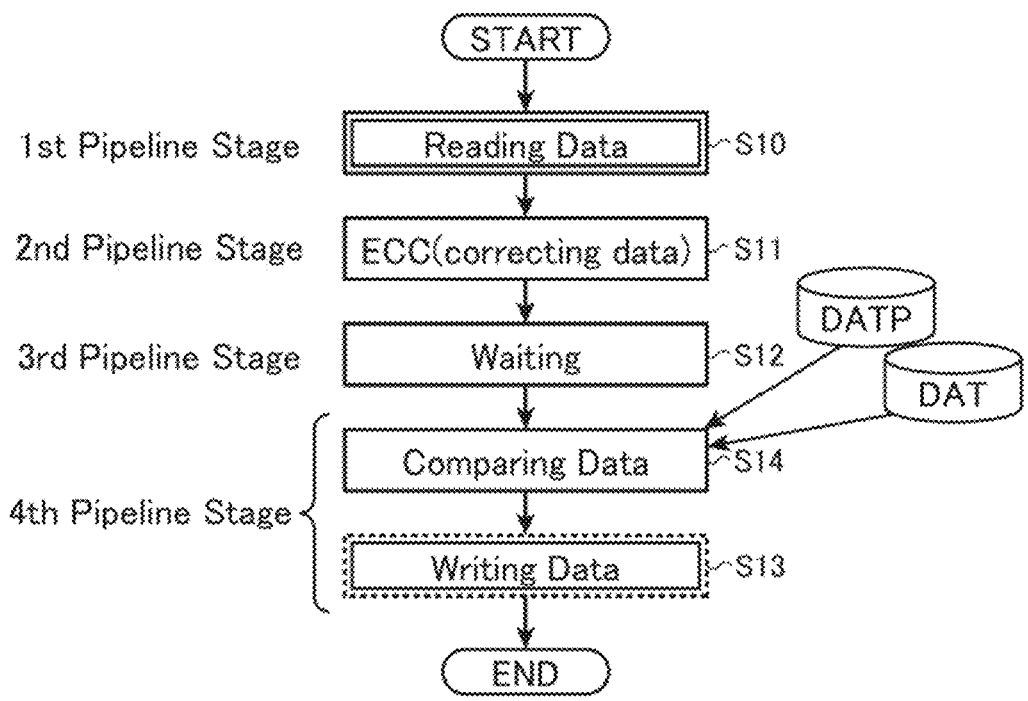
FIG. 7 is a flowchart of a master write operation according to the second embodiment of the present disclosure.

FIG. 7 is a flowchart of the master read operation according to this embodiment. As illustrated in the figure, the difference from FIG. 4A described in the first embodiment is that the read data from the memory cell MC and the data after being subjected to error correction are compared in the fourth pipeline stage (step S14).

That is, in the fourth pipeline stage, the corrected data to which the parity generated in the third pipeline stage is added is transferred to the write driver 28. In this embodiment, the data read in the first pipeline stage is transferred to the write driver 28 through the bypass path described in FIG. 6. This transfer timing may be performed in any of the first to fourth pipeline stages as long as it does not interfere with the next pipeline operation. Then, the write driver 28 compares the data transferred from the check code generator 35 with the data transferred from the sense amplifier 27, and executes the write operation only on the bit line corresponding to the bit whose value is changed.

Figure 8:
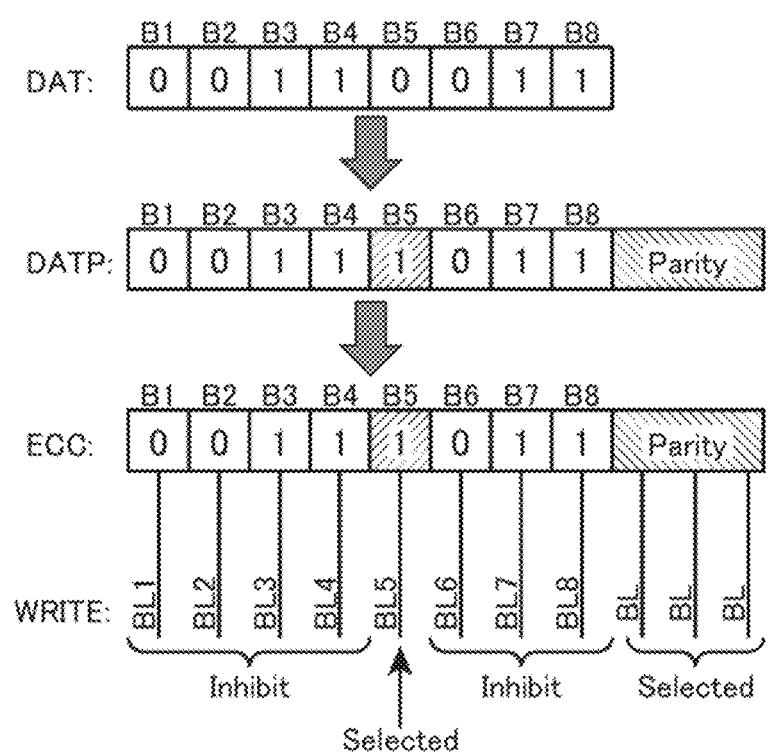
FIG. 8 is a conceptual diagram of the master write operation according to the second embodiment of the present disclosure.

The operation described above will be briefly described using the specific example in FIG. 8. FIG. 8 is a schematic diagram of data processed by the write driver 28.

As illustrated in the figure, it is assumed that data DAT read by the sense amplifier 27 is 8-bit data "00110011". It is assumed that the bits other than the parity of data DATP, which is subjected to error correction and to which parity is added, are 8-bit data of "00111011". Then, the write driver 28 compares the 8-bit data DAT with the 8-bit data DATP. Then, the only bit that differs between the data DAT and DATP is bit B5. That is, this means that the data read by the sense amplifier 27 has an error in bit B5. Accordingly, the write driver 28 inhibit selecting the bit lines corresponding to the other bits B1 to B4 and B6 to B8 and writes data only to the memory cell MC connected to the bit line corresponding to the bit B5 and the bit lines corresponding to the parity.

<<Effects of this Embodiment>>

According to this embodiment, the write driver 28 detects the bit in which the data is inverted, that is, the error bit from the plurality of columns (bit lines) targeted for writing-back. Then, the corrected data is written into the memory cell MC corresponding to the bit in which the data is inverted. Accordingly, the supply of the write current to the memory cell MC, for which rewriting is not demanded, is not demanded. As a result, a deterioration of the memory cell MC can be suppressed and data reliability can be improved.

In the example of FIG. 8, all bits of the parity are written back. However, for the parity as well, only the bit whose value is changed may be written back.

Third Embodiment

Next, a memory device according to the third embodiment of the present disclosure will be described. In this embodiment, in the master write operation described in the first or second embodiment, verification of the data written into the memory cell MC is performed. Only the points different from the first and second embodiments will be described below.

<<Configuration>>

The configuration of the memory device 20 according to this embodiment is as illustrated in FIG. 6 described in the second embodiment, and thus description thereof will be omitted.

<<Operation>>

Figure 9:
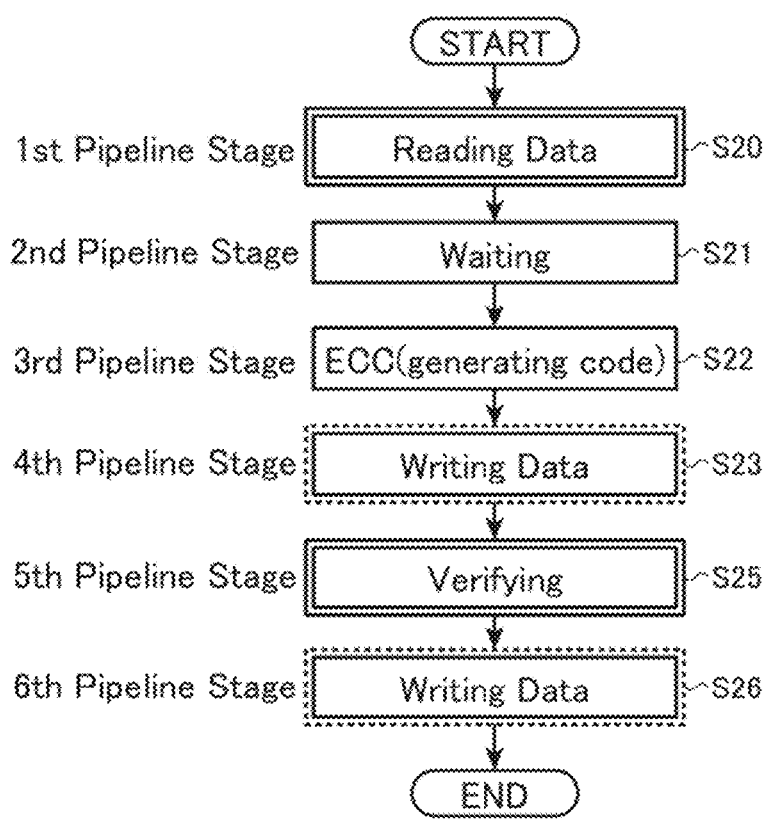
FIG. 9 is a flowchart of a master write operation according to a third embodiment of the present disclosure.

FIG. 9 is a flowchart of the master write operation according to this embodiment. As illustrated, the points different from FIG. 4B described in the first embodiment are as follows. That is, the master write operation is executed by the six pipeline stages, and the fifth and sixth pipeline stages (steps S25 and S26) are sequentially executed after the first to fourth pipeline stages described in the first embodiment.

In the fifth pipeline stage, verification of the data written in step S23 is performed (step S25). That is, the controller 33 of the memory device 20 executes the data read operation on the memory cell MC into which the data is written in step S23. Details of this operation are the same as in step S20. The data read by the sense amplifier 27 is transferred to the write driver 28 via the bypass path connecting the sense amplifier 27 and the write driver 28.

In the sixth pipeline stage, the write driver 28 compares the data written in the memory cell MC in step S23 with the data read in step S25. Then, as a result of the comparison, data is rewritten only for different bits (step S26). For example, it is assumed that the data written in the memory cell MC by the write driver 28 in step S23, in other words, net data (data other than parity) of the data received from the ECC circuit 29 is "00110011". Then, it is assumed that the data read in step S25 is "00111011". Then, it can be seen that the fifth bit data from the start is different from a value to be written. Therefore, in step S26, the write driver 28 rewrites data "0" to the memory cell MC corresponding to the fifth bit from the start. Of course, if there is an error in any of the bits, not only that bit but all bits (and parity) may be rewritten. That is, the data is repaired in step S25, and the repaired data is written back to the memory cell MC in step S26 (accordingly, step S26 can also be referred to as a write repair cycle).

Figure 10:
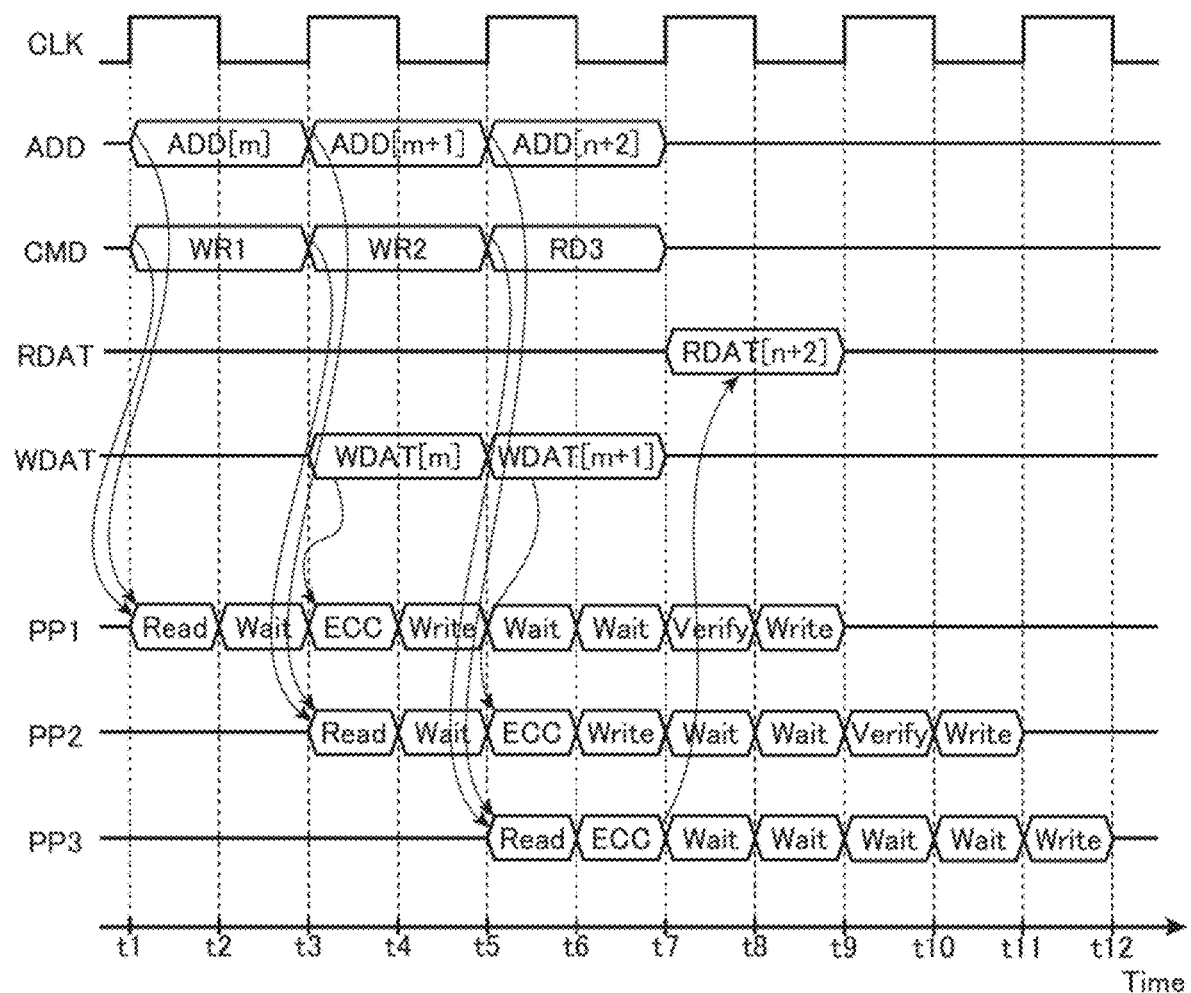
FIG. 10 is a timing chart of various signals when a memory device according to the third embodiment of the present disclosure is accessed.

FIG. 10 corresponds to FIG. 5 described in the first embodiment and illustrates a case where the bus master 10 sequentially issues a first master write command WR1, a second master write command WR2, and a master read command RD3.

As illustrated in the figure, first, in response to the master write command WR1 for the address ADD[m], the pipeline operation PP1 is started at time t1. Next, in response to the master write command WR2 for the address ADD[m+1], the pipeline operation PP2 is started at time t3. Then, in response to the master read command RD3 for the address ADD[n+2], the pipeline operation PP3 is started at time t5. As such, when the pipeline operations are consecutively executed, the controller 33 inserts a wait cycle into each of the pipeline operations PP1 to PP3 as demanded so as to suppress bus contention.

In the example of FIG. 10, a case where the pipeline operations PP1 and PP2 are executed in eight pipeline stages and the pipeline operation PP3 is executed in seven pipeline stages is illustrated. As illustrated, in the pipeline operation PP1, two wait cycles are inserted during the period from time t5 to t7. During this period, the ECC operation (step S22) and the write operation (step S23) of the pipeline operation PP2, and the read operation (step S10) and the ECC operation (step S11) of the pipeline operation PP3 are executed. Similarly, in the pipeline operation PP2, two wait cycles are inserted during the period from time t7 to time t9. During this period, the verify operation (step S25) and the write operation (step S26) of the pipeline operation PP1 are executed. In the pipeline operation PP3, three wait cycles are inserted during the period from time t8 to t11. During this period, the write operation of the pipeline operation PP1 (step S26) and the verify operation (step S25) and write operation (step S26) of the pipeline operation PP2 are executed.

As described above, access efficiency to the memory cell array 21 can be improved by appropriately providing the wait cycle.

<<Effects of this Embodiment>>

According to this embodiment, in the master write operation, the written data is verified, and the bit having the write error is rewritten. For that reason, the write error can be suppressed and reliability of the master write operation can be improved.

Fourth Embodiment

Next, a memory device according to the fourth embodiment of the present disclosure will be described. This embodiment relates to details of the operation of the memory device 20 during the master read operation and the master write operation in the first embodiment. In the following, a case where the master read operations are consecutively performed, a case where the master write operations are consecutively performed, and a case where the master write operations and the master read operations are consecutively performed will be described as an example.

<<Case where Master Read Operations are Consecutive>>

First, the case where the master read operations are consecutive will be described with reference to FIGS. 11A to 11F. FIGS. 11A to 11F are block diagrams of the memory device 20, and correspond to the operation during the period from time t1 to t7 in FIG. 5. In FIGS. 11A to 11F, a flow of signals is also illustrated, and solid line arrows in the figures indicate valid signal flows, and broken line arrows indicate that signals are not transferred through the path. This is also applied to the description of the case where the master write operations described below are consecutively performed and the case where the master write operation and the master read operation are consecutively performed described below.

Figure 11A:
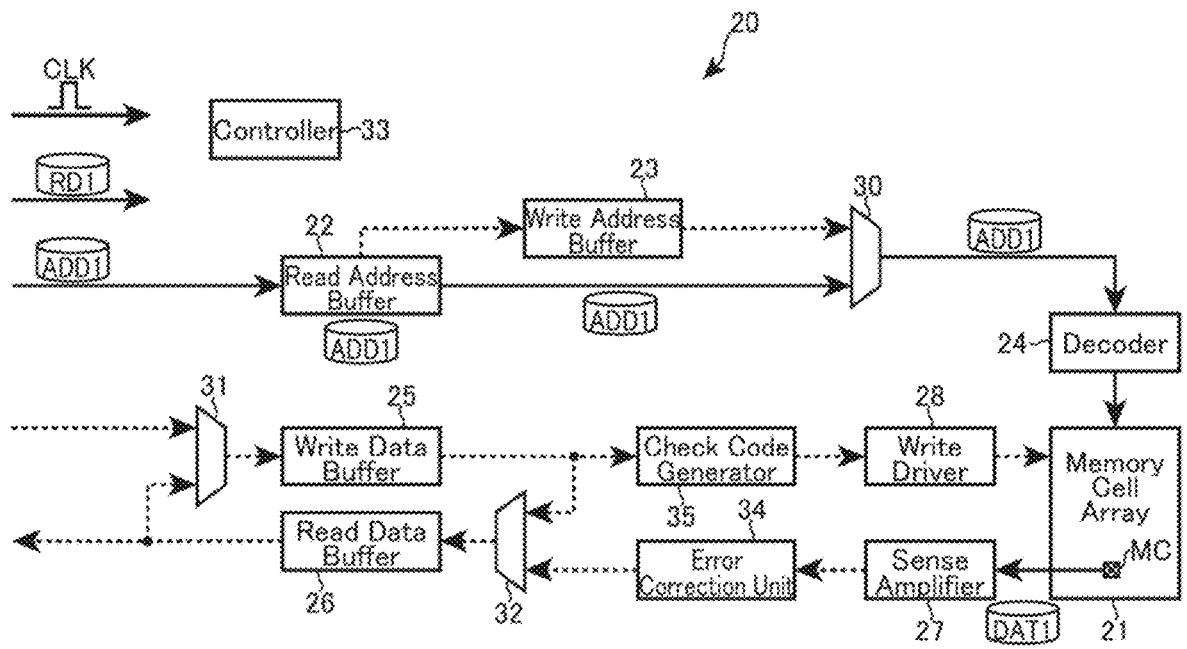
FIG. 11A is a block diagram of a memory device according to a fourth embodiment of the present disclosure.

FIG. 11A corresponds to time t1 to t2 in FIG. 5. That is, the memory device 20 receives the first master read command RD1 and the address ADD1 transmitted from the bus master 10 in synchronization with the clock CLK. The address ADD1 is held in the address buffer 22, and the controller 33 further instructs the selector 30 to select the output of the address buffer 22. As a result, the address ADD1 is transferred to the decoder 24 and data DAT1 is read by the sense amplifier 27 from the memory cell MC in the memory cell array 21.

Figure 11B:
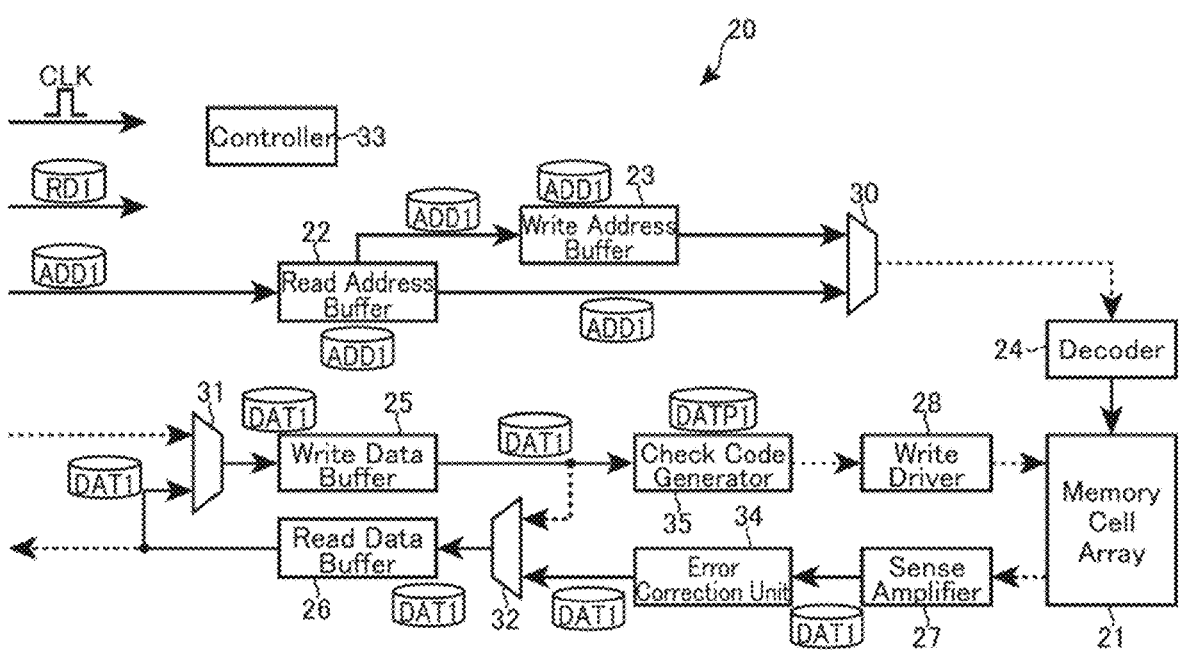
FIG. 11B is another block diagram of the memory device according to the fourth embodiment of the present disclosure.

FIG. 11B corresponds to time t2 to t3 in FIG. 5. That is, the memory device 20 executes ECC processing on the data DAT1 read from the memory cell array 21. That is, the data DAT1 is transferred from the sense amplifier 27 to the error correction circuit 34, and the error thereof is corrected. Furthermore, the controller 33 instructs the selector 32 to select the output of the error correction circuit 34. With this configuration, the data DAT1 after being subjected to error correction is held in the data buffer 26. Furthermore, the controller 33 instructs the selector 32 to select the output of the data buffer 26. With this configuration, the data DAT1 after being subjected to error correction is held in the data buffer 25. Furthermore, the data DAT1 is transferred from the data buffer 25 to the check code generator 35, and the parity is generated. A combination of the data DAT1 after being subjected to error correction and the parity is referred to as data DATP1. The address ADD1 held in the address buffer 22 is transferred to the address buffer 23.

Figure 11C:
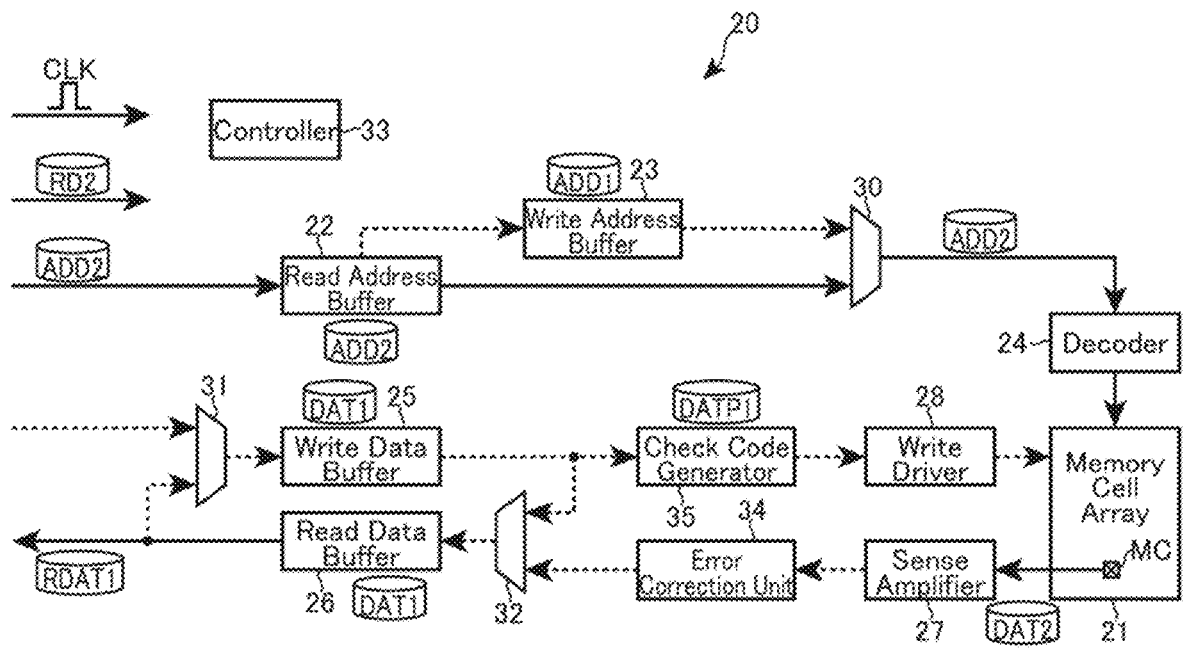
FIG. 11C is another block diagram of the memory device according to the fourth embodiment of the present disclosure.

FIG. 11C corresponds to time t3 to t4 in FIG. 5. During this period, the pipeline operation PP1 based on the master read command RD1 executes a wait cycle. That is, the operations of the sense amplifier 27 and the write driver 28 based on the master read command RD1 are not performed. At the timing of time t3, the data DAT1 after being subjected to error correction held in the data buffer 26 is output to the bus master 10 as read data RDAT1 from the memory device 20.

In a time period from time t3 to t4, the memory device 20 receives the second master read command RD2 and an address ADD2 transmitted from the bus master 10 in synchronization with the clock CLK. The address ADD2 is held in the address buffer 22, and the controller 33 further instructs the selector 30 to select the output of the address buffer 22. As a result, the address ADD2 is transferred to the decoder 24, and the data DAT2 is read by the sense amplifier 27 from the memory cell MC in the memory cell array 21.

Figure 11D:
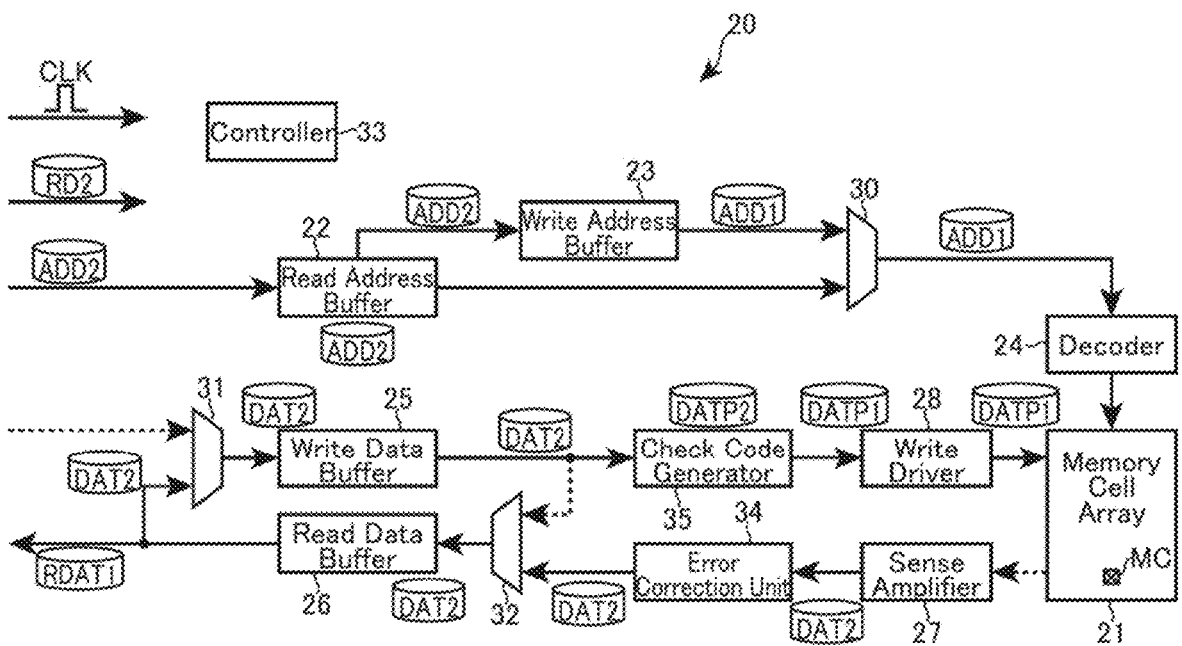
FIG. 11D is another block diagram of the memory device according to the fourth embodiment of the present disclosure.

FIG. 11D corresponds to time t4 to t5 in FIG. 5. That is, the memory device 20 transfers the data DATP1 generated by the check code generator 35 to the write driver 28 regarding the pipeline operation PP1. According to an instruction from the controller 33, the selector 30 selects the address ADD1 held in the address buffer 23 and transfers the address ADD1 to the decoder 24. As a result, the data DATP1 is written in the address ADD1.

Regarding the pipeline operation PP2, ECC processing described in FIG. 11B is executed. That is, the data DAT2 is transferred from the sense amplifier 27 to the error correction circuit 34, the error thereof is corrected, and further transferred to the data buffer 25 and the check code generator 35 via the selector 32 and the parity is generated. The combination of the data DAT2 after being subjected to error correction and the parity is referred to as data DATP2. The address ADD2 held in the address buffer 22 is transferred to the address buffer 23.

Figure 11E:
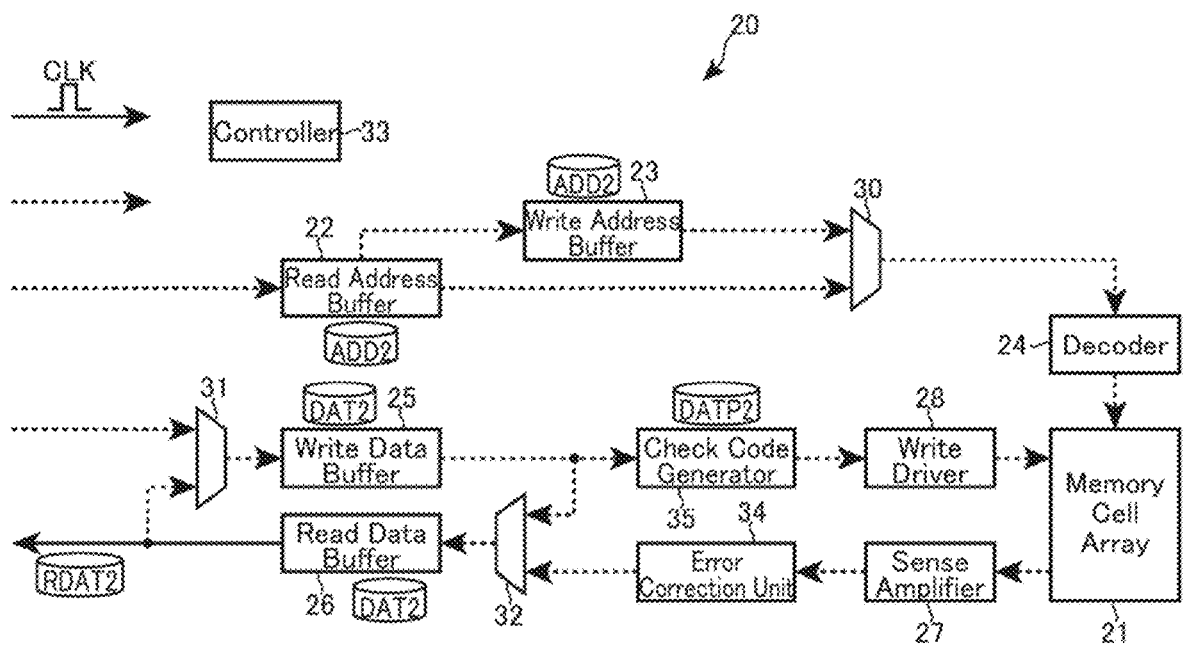
FIG. 11E is another block diagram of the memory device according to the fourth embodiment of the present disclosure.

FIG. 11E corresponds to time t5 to t6 in FIG. 5. During this period, the pipeline operation PP2 based on the master read command RD2 executes a wait cycle. That is, the operations of the sense amplifier 27 and the write driver 28 based on the master read command RD2 are not performed. At the timing of time t3, the data DAT2 after being subjected to error correction held in the data buffer 26 is output to the bus master 10 as the read data RDAT2 from the memory device 20.

Figure 11F:
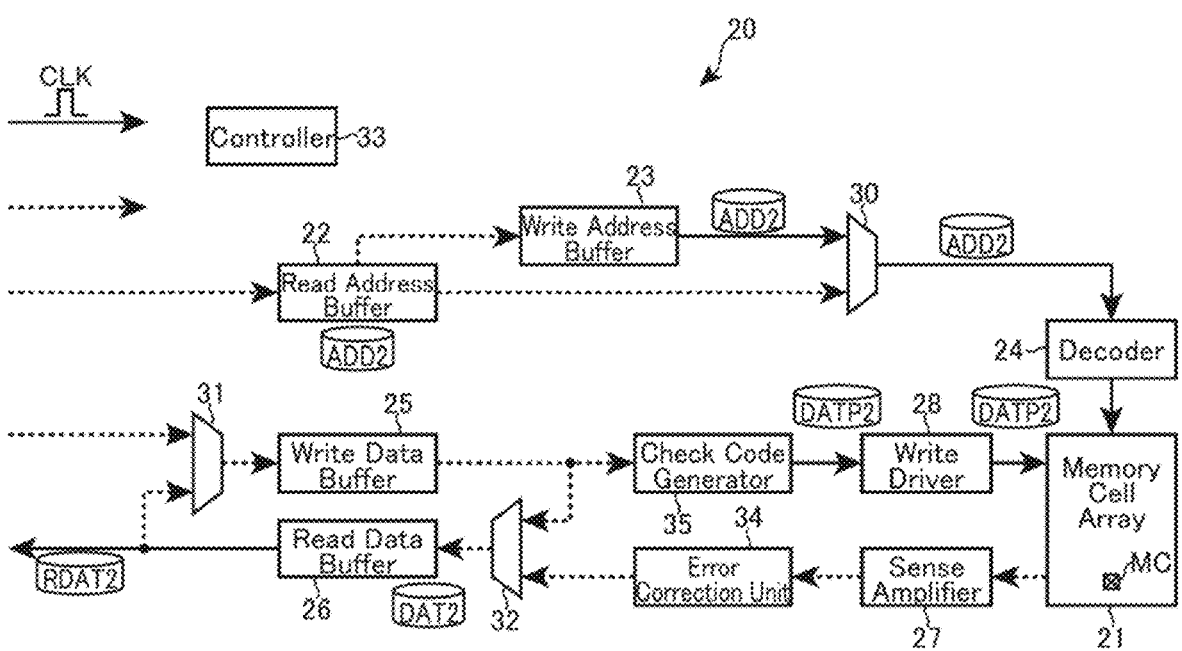
FIG. 11F is another block diagram of the memory device according to the fourth embodiment of the present disclosure.

FIG. 11F corresponds to time t6 to t7 in FIG. 5. That is, the memory device 20 transfers the data DATP2 generated by the check code generator 35 to the write driver 28. According to an instruction from the controller 33, the selector 30 selects the address ADD2 held in the address buffer 23 and transfers the address ADD2 to the decoder 24. As a result, the data DATP2 is written in the address ADD2.

<<Case where Master Write Operations are Consecutive>>

Next, the case where the master write operations are consecutive will be described with reference to FIGS. 12A to 12F. FIGS. 12A to 12F are block diagrams of the memory device 20, and correspond to the operation during the period from time t5 to t11 in FIG. 5.

Figure 12A:
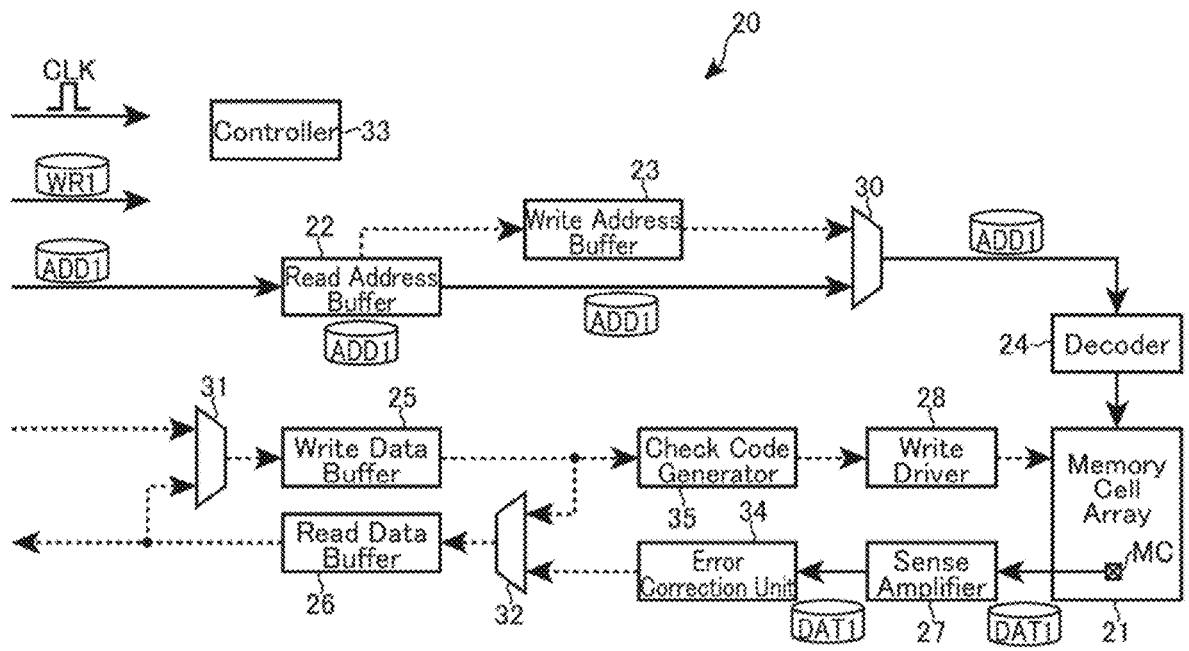
FIG. 12A is another block diagram of the memory device according to the fourth embodiment of the present disclosure.

FIG. 12A corresponds to time t5 to t6 in FIG. 5. That is, the memory device 20 receives the first master write command WR1 and the address ADD1 transmitted from the bus master 10 in synchronization with the clock CLK. Then, similarly as in the case of FIG. 11A, the address ADD1 is held in the address buffer 22, and the address ADD1 is further transferred to the decoder 24 via the selector 30. Then, the data DAT1 is read from the memory cell MC in the memory cell array 21 by the sense amplifier 27, and the error of the data DAT1 is further corrected by the error correction circuit 34.

Figure 12B:
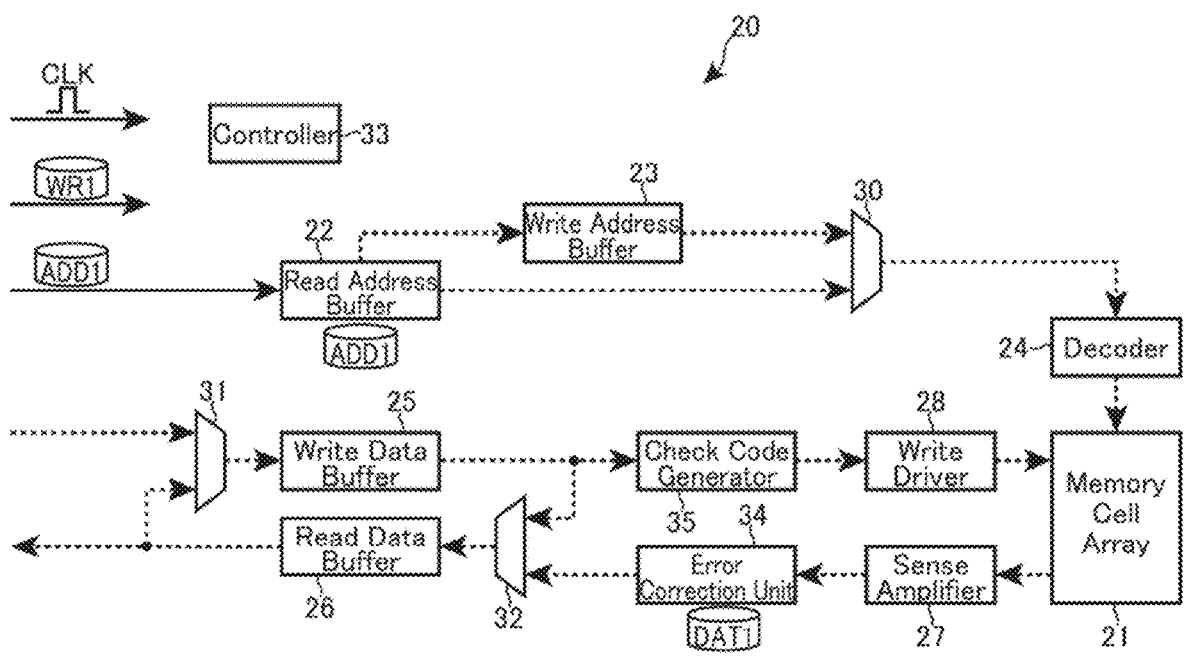
FIG. 12B is another block diagram of the memory device according to the fourth embodiment of the present disclosure.

FIG. 12B corresponds to time t6 to t7 in FIG. 5. During this period, the pipeline operation PP3 based on the master write command WR1 executes a wait cycle. That is, the operations of the sense amplifier 27 and the write driver 28 based on the master write command WR1 are not performed.

Figure 12C:
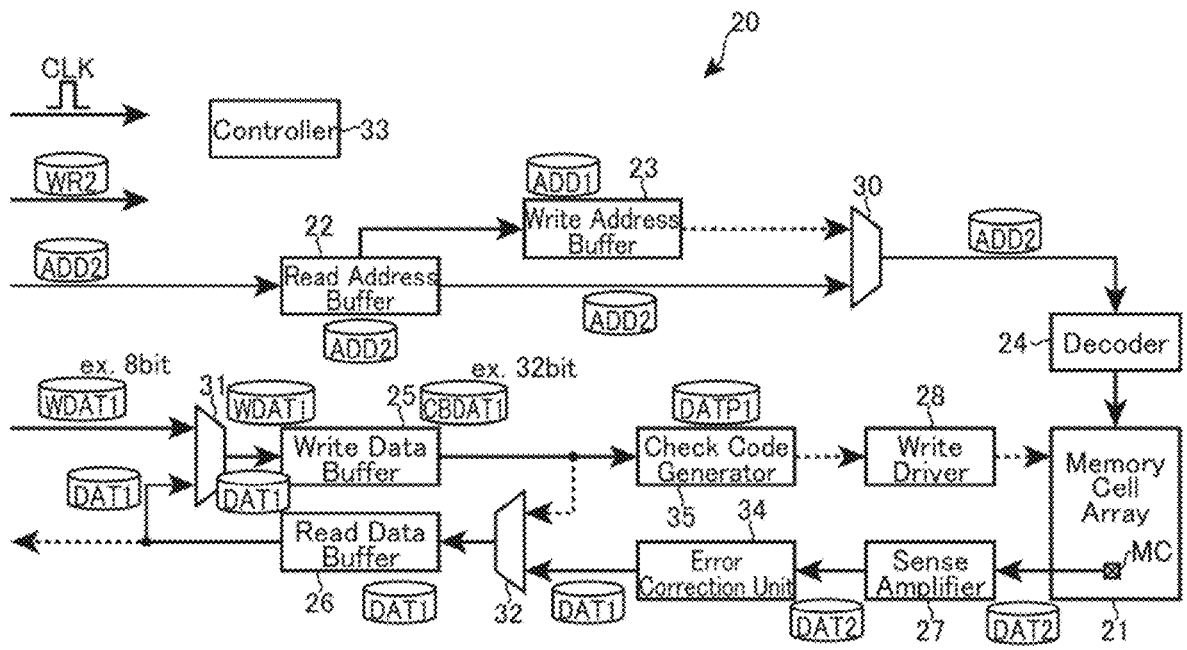
FIG. 12C is another block diagram of the memory device according to the fourth embodiment of the present disclosure.

FIG. 12C corresponds to time t7 to t8 in FIG. 5. That is, the memory device 20 receives write data WDAT1 transmitted from the bus master 10 in synchronization with the clock CLK and performs ECC processing. As illustrated in the figure, the selector 31 transfers the data WDAT1 transmitted from the bus master 10 to the data buffer 25 based on the instruction of the controller 33. Furthermore, the controller 33 instructs the selector 32 to select the output of the error correction circuit 34. With this configuration, the data DAT1 after being subjected to error correction is held in the data buffer 26. Furthermore, the controller 33 instructs the selector 31 to select the output of the data buffer 26. With this configuration, the data DAT1 after being subjected to error correction is transferred to the data buffer 25. The reason why the data WDAT1 and DAT1 are transferred to the data buffer 25 is as follows. That is, the parity is generated in units of a certain fixed bits. In this example, it is assumed that the parity is generated in units of 32 bits, for example. However, the number of bits of the data WDAT1 transmitted from the bus master 10 may not be limited to 32 bits. For example, in the example of FIG. 12C, the data WDAT1 is 8 bits. Then, the number of bits (24 bits) for parity generation is insufficient. Accordingly, the data buffer 25 supplements lacking 24 bits with the data DAT1 to generate write data CBDAT1 of 32 bits. Then, the data CBDAT1 is transferred from the data buffer 25 to the check code generator 35, and the parity is generated. A combination of data CBDAT1 and parity is referred to as data DATP1.

In a time period from time t7 to t8, the memory device 20 receives the second master write command WR2 and the address ADD2 transmitted from the bus master 10 in synchronization with the clock CLK. The address ADD2 is held in the address buffer 22, and the controller 33 further instructs the selector 30 to select the output of the address buffer 22. As a result, the address ADD2 is transferred to the decoder 24, the data DAT2 is read from the memory cell MC in the memory cell array 21 by the sense amplifier 27, and the error of the data DAT12 is corrected by the error correction circuit 34. The address ADD1 held in the address buffer 22 until that time is transferred to the address buffer 23.

Figure 12D:
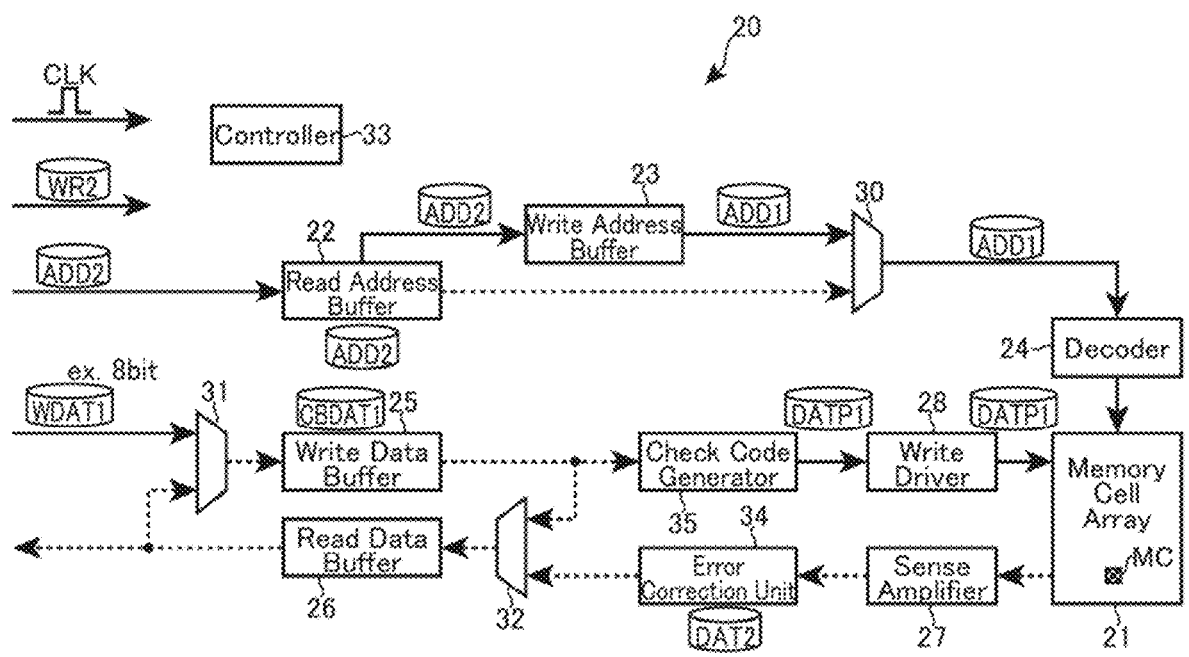
FIG. 12D is another block diagram of the memory device according to the fourth embodiment of the present disclosure.

FIG. 12D corresponds to time t8 to t9 in FIG. 5. That is, regarding the pipeline operation PP3, the memory device 20 transfers the data DATP1 generated by the check code generator 35 to the write driver 28. According to an instruction from the controller 33, the selector 30 selects the address ADD1 held in the address buffer 23 and transfers the address ADD1 to the decoder 24. As a result, the data DATP1 is written in the address ADD1.

During the period from time t8 to t9, the pipeline operation PP4 based on the master write command WR2 executes a wait cycle. That is, the operations of the sense amplifier 27 and the write driver 28 based on the master write command WR2 are not performed.

Figure 12E:
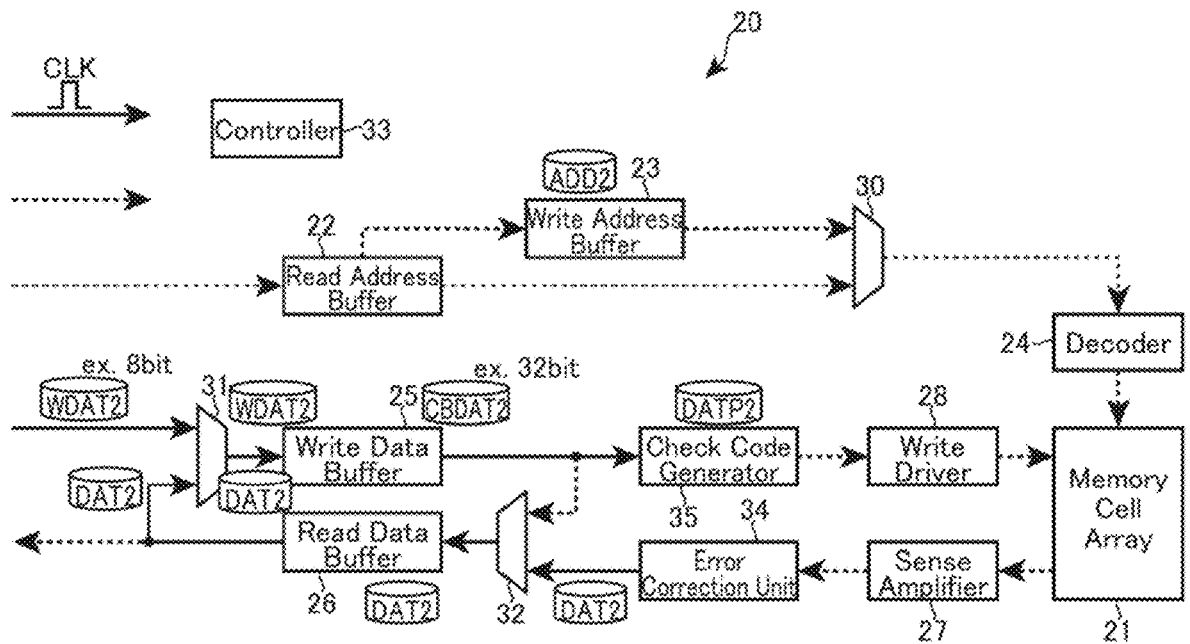
FIG. 12E is another block diagram of the memory device according to the fourth embodiment of the present disclosure.

FIG. 12E corresponds to time t9 to t10 in FIG. 5.

That is, similarly to FIG. 12C, the memory device 20 receives write data WDAT2 from the bus master 10 in synchronization with the clock CLK and performs ECC processing. As illustrated, the data WDAT1 is transferred to the data buffer 25, and the data DAT2 after being subjected to error correction is transferred from the data buffer 26 to the data buffer 25. With this configuration, for example, write data CBDAT2 of 32 bits is generated. Then, the data CBDAT2 is transferred from the data buffer 25 to the check code generator 35, and the parity is generated. A combination of the data CBDAT2 and parity is referred to as data DATP2.

Figure 12F:
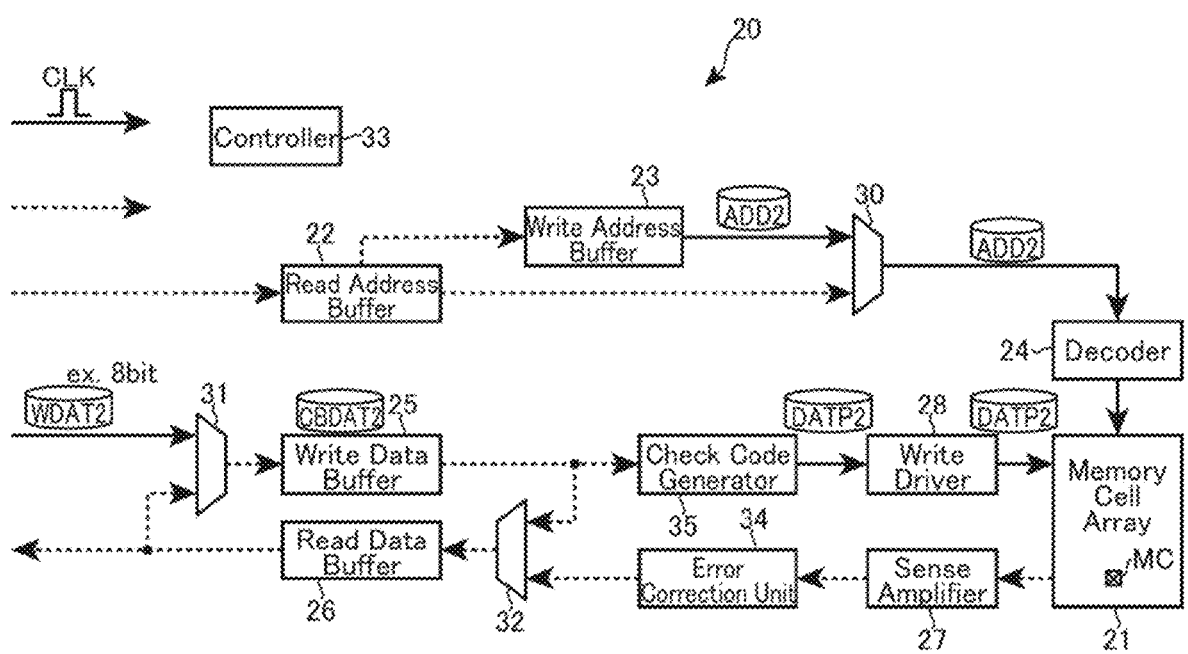
FIG. 12F is another block diagram of the memory device according to the fourth embodiment of the present disclosure.

FIG. 12F corresponds to time t10 to t11 in FIG. 5. That is, the memory device 20 transfers the data DATP2 generated by the check code generator 35 to the write driver 28. According to an instruction from the controller 33, the selector 30 selects the address ADD2 held in the address buffer 23 and transfers the address ADD2 to the decoder 24. As a result, the data DATP2 is written in the address ADD2.

<<Case where Master Write Operation and Master Read Operation are Consecutive>>

Next, the case where the master write operation is executed and the master read operation is consecutively executed will be described. This operation corresponds to the operation in the period from time t7 to t13 in FIG. 5.

When the address targeted for the master write operation and the address targeted for the master read operation are different, the combination of, for example, FIGS. 12A to 12D and 11A to 11D described above is obtained. That is, the operation described in FIG. 12A is executed during the period from time t7 to t8, and the operation described in FIG. 12B is executed during the period from time t8 to t9. After that, in a time period from time t9 to t10, the ECC cycle described in FIG. 12C is executed for the master write operation, and the read cycle described in FIG. 11A is executed for the master read operation. In a time period from time t10 to t11, the write cycle described in FIG. 12D is executed for the master write operation, and the ECC cycle described in FIG. 11B is executed for the master read operation. After that, the wait cycle and the write cycle described in FIGS. 11C and 11D are executed for the master read operation.

Figure 13A:
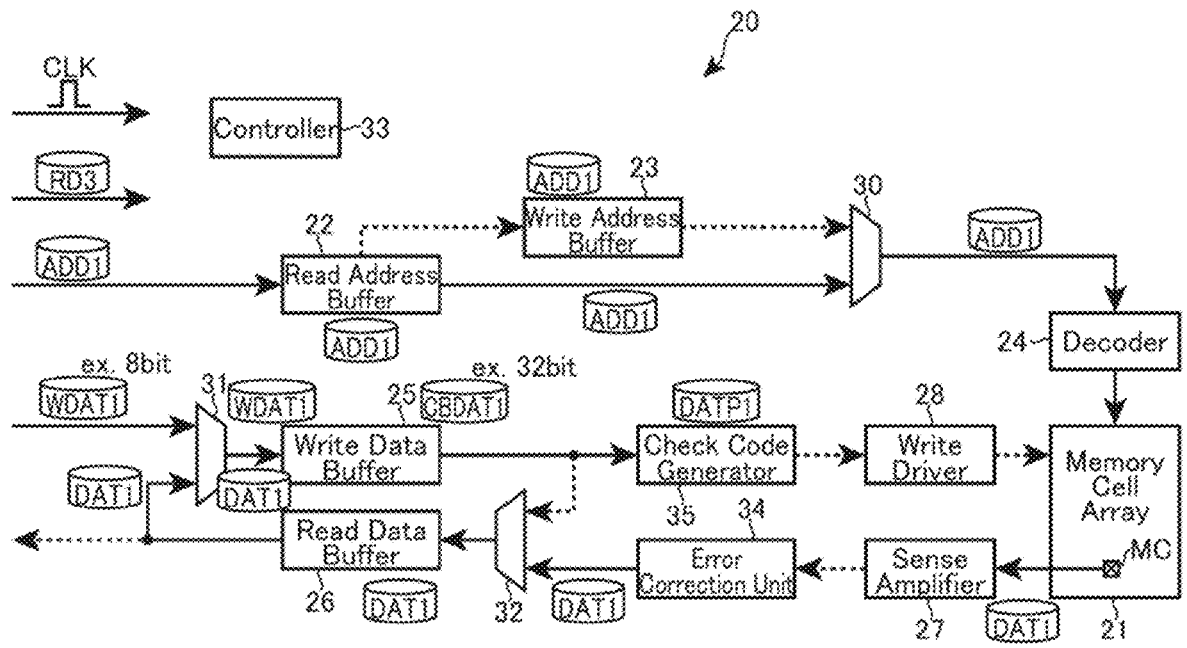
FIG. 13A is another block diagram of the memory device according to the fourth embodiment of the present disclosure.

Next, the case where the address targeted for the master write operation and the address targeted for the master read operation are the same will be described. First, during the period from time t7 to t9, the operation described with reference to FIGS. 12A and 12B is executed in the same manner as above. After that, also during the period from time t9 to t10, the operation described in FIGS. 12C and 11A is executed in the same manner as above. This state is illustrated in FIG. 13A. FIG. 13A is different from FIG. 12C in that the master read command RD3 is transmitted from the bus master 10 and the target address is the same as the target address of the immediately preceding master write command WR2 (ADD1). As described with reference to FIG. 12C, in the data buffer 25, the data CBDAT1 is generated based on the write data WDAT and the corrected read data DAT1.

Figure 13B:
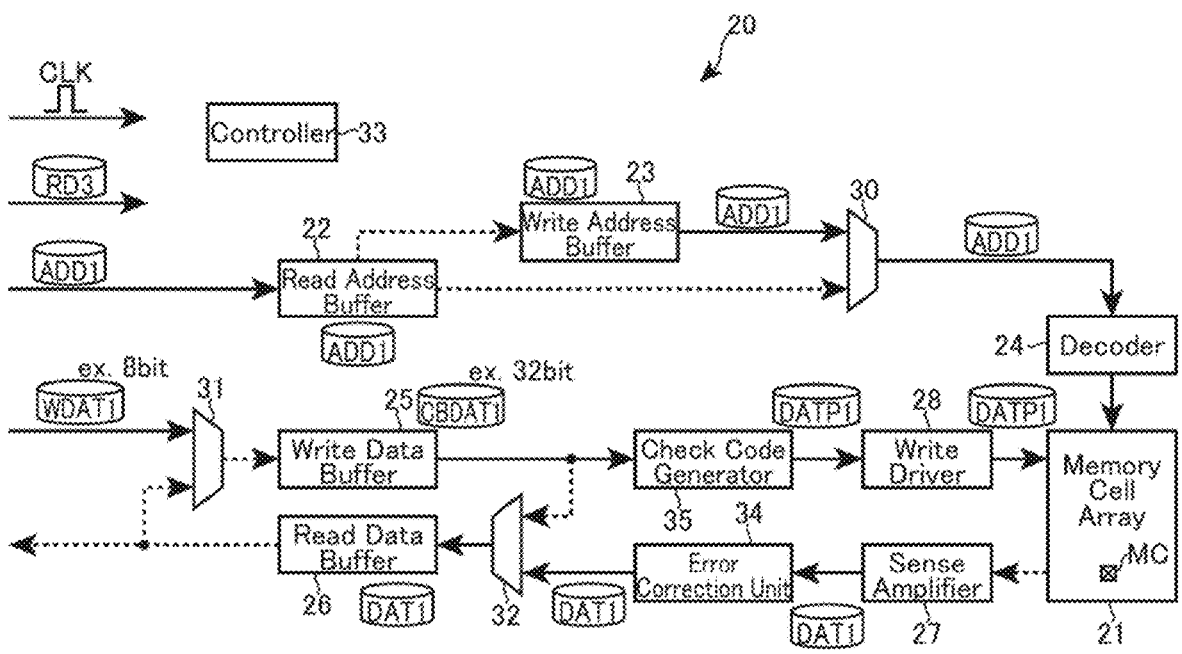
FIG. 13B is another block diagram of the memory device according to the fourth embodiment of the present disclosure.
Figure 13C:
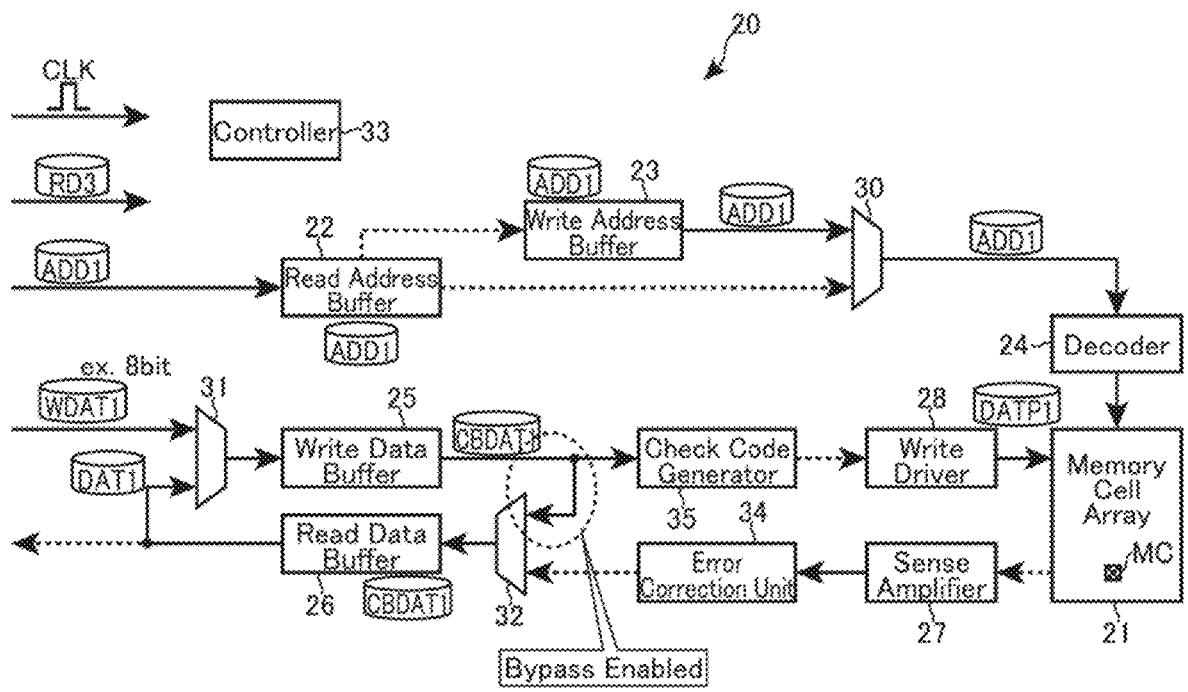
FIG. 13C is another block diagram of the memory device according to the fourth embodiment of the present disclosure.
Figure 13D:
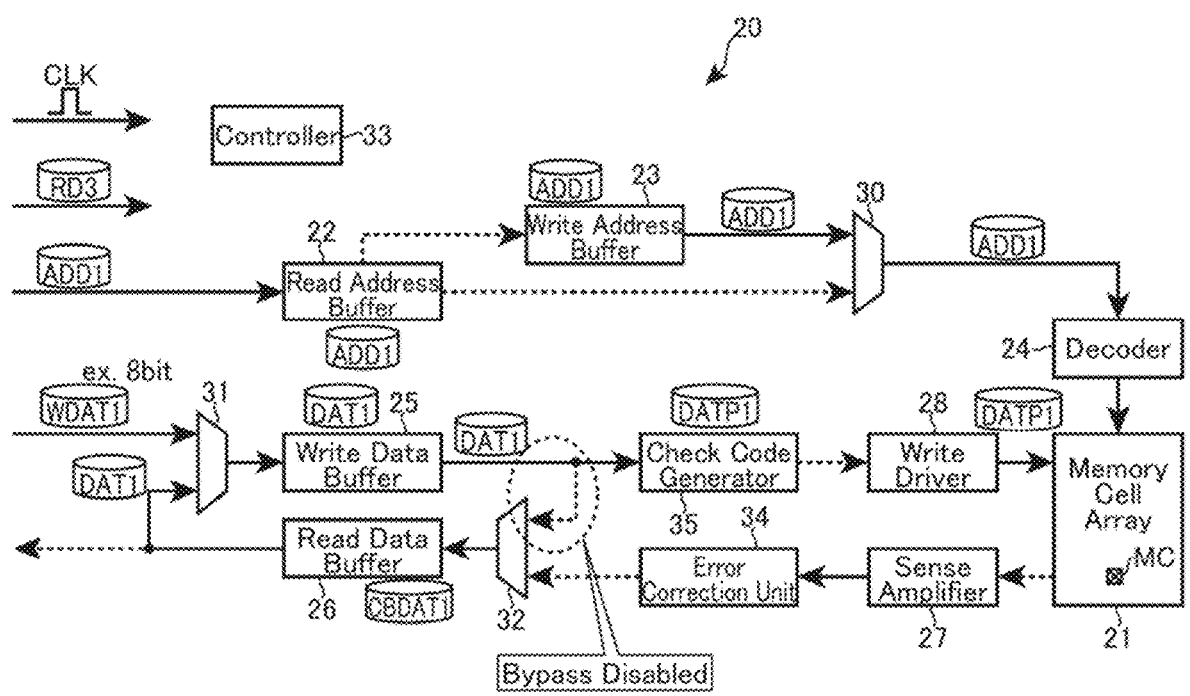
FIG. 13D is another block diagram of the memory device according to the fourth embodiment of the present disclosure.

Next, during the period from time t10 to t11, the operations illustrated in FIGS. 13B to 13D are executed. First, as illustrated in FIG. 13B, the data CBDAT1 is held in the data buffer 25 while the data DATP1 is written into the memory cell MC based on the master write command WR2, and the data DAT1 read out based on the master read instruction is held in the data buffer 26.

Next, as illustrated in FIG. 13C, the controller 33 causes the selector 31 to select the data buffer 26 in response to the fact that the target address of the master write operation is the same as the target address of the master read operation. As a result, the data CBDAT1 including the write data WDAT1 is transferred to the data buffer 26, and the read data DAT1 held in the data buffer 26 until that time is expelled. Subsequently, as illustrated in FIG. 13D, the controller 33 causes the selector 31 to select the data buffer 26 and disables the selector 32. As a result, the data DAT1 is held in the data buffer 25. That is, by the operations illustrated in FIGS. 13C and 13D, the data (CBDAT1 and DAT1) held in the data buffers 25 and 26 are exchanged.

Figure 13E:
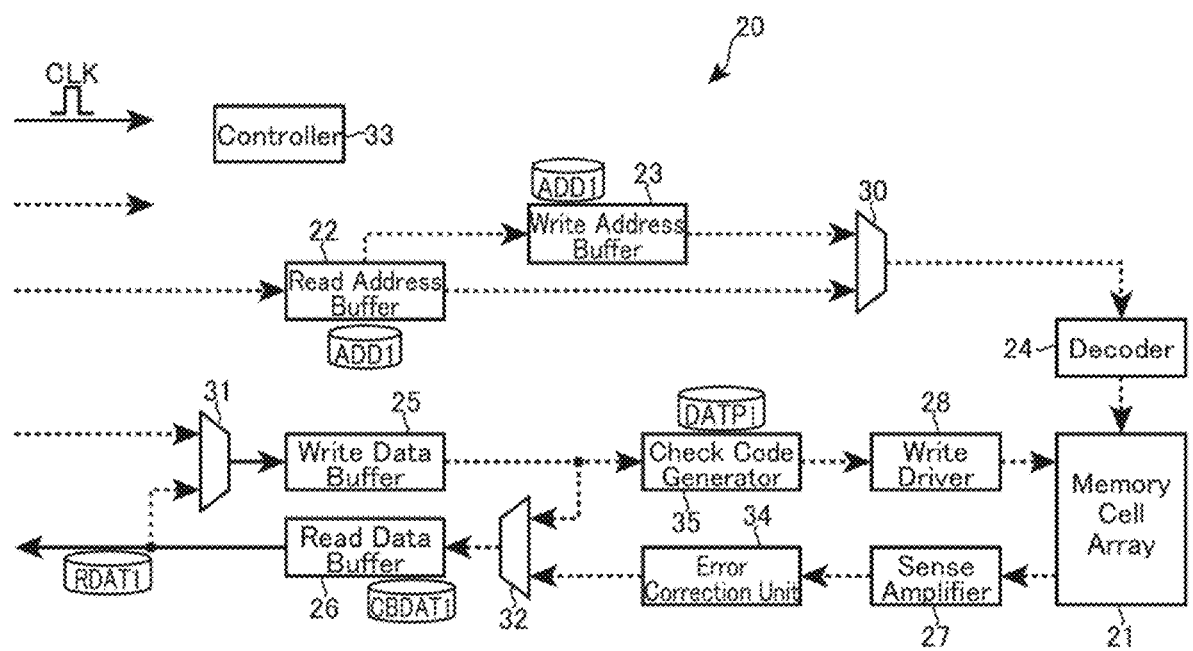
FIG. 13E is another block diagram of the memory device according to the fourth embodiment of the present disclosure.

FIG. 13E corresponds to the period from time t11 to t12 in FIG. 5. As illustrated, the wait cycle is executed, and the data CBDAT1 in the data buffer 26 is output to the bus master 10 as the read data RDAT1 of the memory device 20.

<<Effects of this Embodiment>>

The pipeline stages described in the first to third embodiments can be realized by the operations described in this embodiment.

As illustrated in FIG. 4E, when the master write operation and the master read operation are consecutively performed, the read cycle in the master read operation (step S10) is executed before the write cycle in the master write operation (step S23). In view of this point, in this embodiment, when the addresses targeted for the master write operation and the master read operation are the same, instead of the data DAT actually read from the memory cell MC, the write data CBDAT (see FIGS. 13C to 13E) generated by the master write operation is output to the bus master 10 as the read data RDAT. With this configuration, data to be written in the master write operation can be treated as read data, and correct data can be output to the bus master 10.

Description of the case where the master read operation and the master write operation are executed consecutively is omitted. However, in this case, for example, the processing of FIGS. 11A to 11D may be executed for the master read operation and the processing of FIGS. 12A to 12D may be executed for the master write operation. In this case, since data is read in the first pipeline stage in the master read operation and data is written in the fourth pipeline stage in the master write operation, there is no particular problem even if the access target is the same address.

<Modification Example or the Like>

As described above, according to the memory devices according to the first to fourth embodiments, operation reliability can be improved. Although the description as above is made using various embodiments, the embodiments are not limited to those described above, and various modifications may be made thereto.

Figure 14:
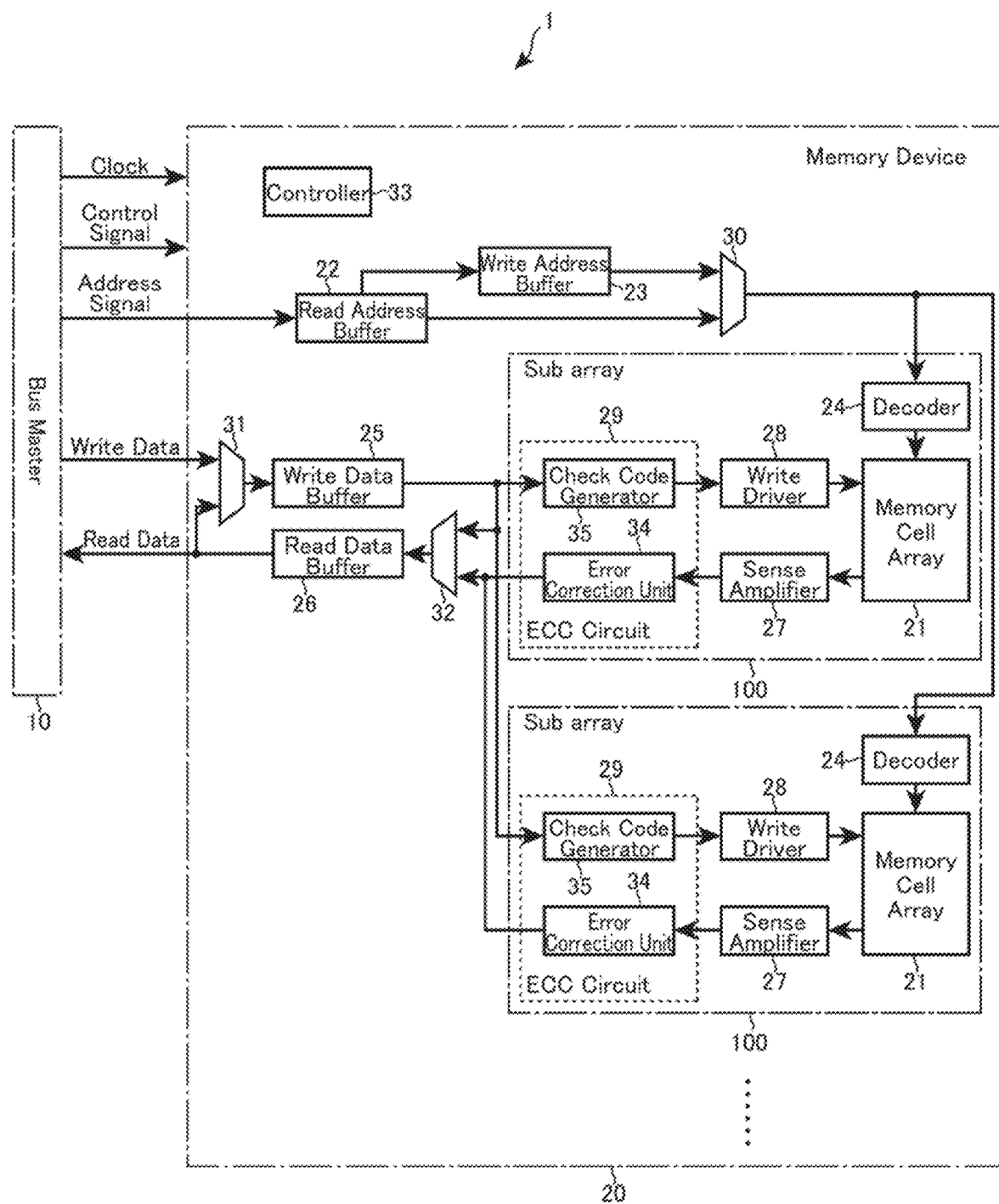
FIG. 14 is a block diagram of a processor system according to a modification example of the first to fourth embodiments of the present disclosure.

For example, in the embodiments described above, the case where the memory device 20 includes one set of the memory cell array 21, the decoder 24, the sense amplifier 27, the write driver 28, and the ECC circuit 29 is described as an example. However, as illustrated in FIG. 14, a plurality of these sets may be provided. FIG. 14 is a block diagram of a processor system 1 according to a modification example of the embodiments described above. As illustrated, the memory device 20 includes a plurality of sets of the memory cell array 21, the decoder 24, the sense amplifier 27, the write driver 28, and the ECC circuit 29. Each of these set is referred to as a sub array 100. The plurality of sub arrays 100 share the address buffers 22 and 23, the data buffers 25 and 26, and the selectors 30 to 32, and are controlled by the controller 33. According to this configuration, since the decoder 24, the sense amplifier 27, the write driver 28, and the ECC circuit 29 are provided for each memory cell array 21, data writing and reading are simultaneously executed for the memory cell arrays 21 of the plurality of sub arrays 100.

Figure 15:
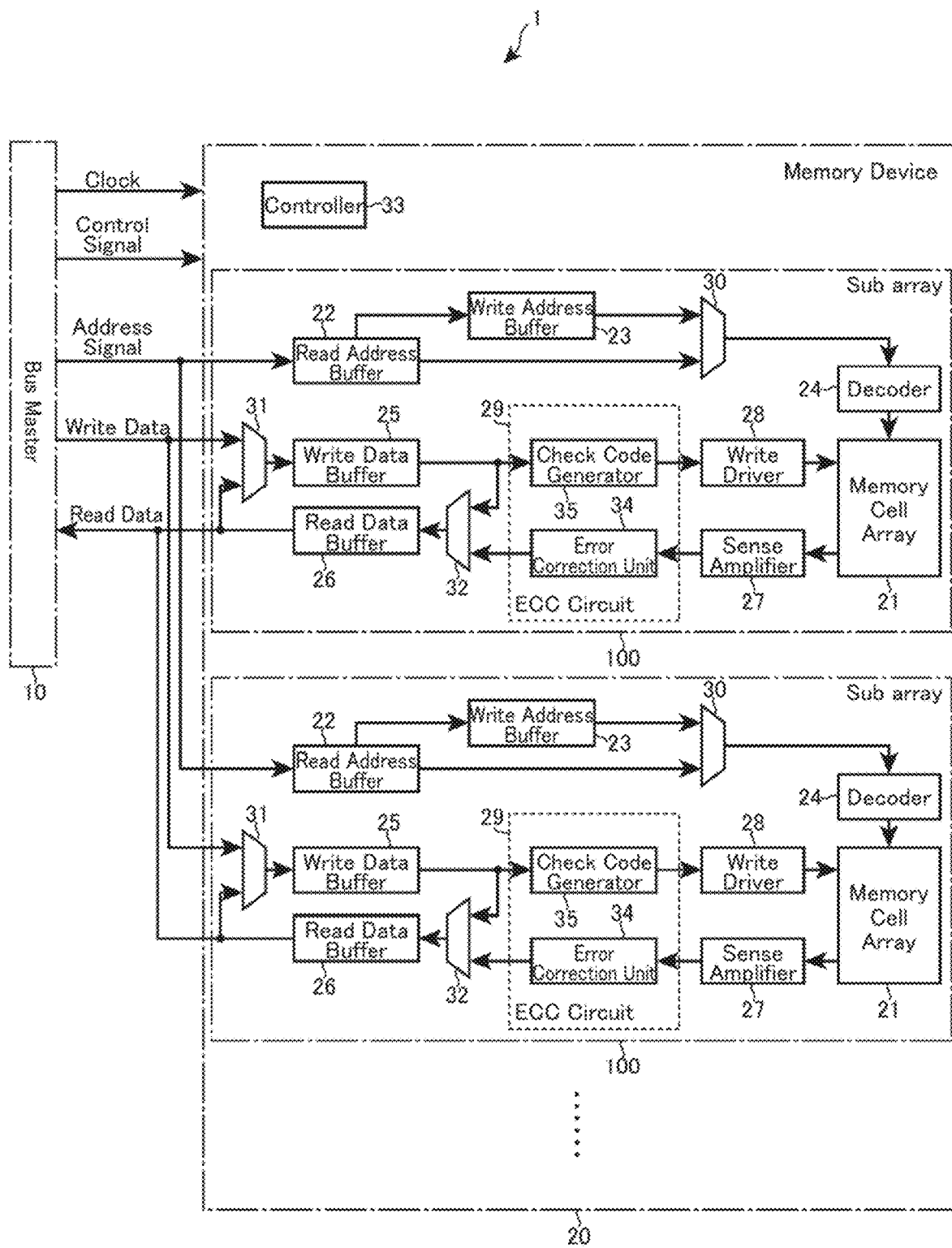
FIG. 15 is a block diagram of another processor system according to the modification example of the first to fourth embodiments of the present disclosure.

Furthermore, as illustrated in FIG. 15, the address buffers 22 and 23, the data buffers 25 and 26, and the selectors 30 to 32 may also be provided for each sub array 100. In this case, the sub arrays 100 can operate independently of each other, and the bus master 10 can access the plurality of sub arrays 100 in parallel.

In the embodiments described above, the MRAM is described as an example of the memory device 20. However, the memory device 20 is not limited to MRAM, and may be, for example, ReRAM, PCM, or other non-volatile memory.

Furthermore, although an example of the pipeline stage is illustrated in FIGS. 4A and 4B, the order may not be limited to this order, and wait cycles may be added or the order of processing may be changed as demanded. The order of pipeline stages is not limited as long as there is no bus contention with other pipelines. In FIGS. 4C to 4E, the case where the access from the bus master 10 is performed twice consecutively is illustrated as an example, but the number of access times is not limited to two, and the number is not limited. In the embodiments above, the case where the memory device 20 is always accessed from the bus master 10 is described as an example, but a cycle (wait or standby state) in which access is not made from the bus master 10 may be included.

In the embodiments described above, although the processor system 1 is described as an example, a memory system may be used instead of the processor system 1, for example. In this case, the memory device 20 may be a memory for storage, and the bus master 10 may be a host device such as a personal computer or a digital camera.

While there have been described what are at present considered to be certain embodiments of the invention, it will be understood that various modifications may be made thereto, and it is intended that the appended claim cover all such modifications as fall within the true spirit and scope of the invention.

It should be understood by those skilled in the art that various modifications, combinations, sub-combinations and alterations may occur depending on design requirements and other factors insofar as they are within the scope of the appended claims or the equivalents thereof.

What is claimed is:
1. A memory device comprising:
a memory cell capable of holding data;
an ECC circuit capable of generating a correction code and detecting an error based on the correction code; and
at least two address buffers,
wherein the memory cell is accessed by a pipeline operation, and the pipeline operation includes at least four pipeline stages including
a read cycle reading data from the memory cell,
an ECC cycle executing generation of the correction code or error detection for the memory cell in the ECC circuit,
a wait cycle during which processing for data related to the memory cell is not executed and
a write cycle writing data into the memory cell, and
wherein the address buffers include a write address buffer capable of holding an address of the memory cell received from an outside during an operation of writing data, and
a read address buffer capable of holding an address of the memory cell received from an outside during an operation of reading data.

2. The memory device according to claim 1, further comprising:
a write data buffer capable of holding write data into the memory cell;
a read data buffer capable of holding read data from the memory cell;
a first signal path capable of transferring data from the read data buffer to the write data buffer; and
a second signal path capable of transferring data from the write data buffer to the read data buffer.

3. A memory device comprising:
a memory cell capable of holding data; and
an ECC circuit capable of generating a correction code and detecting an error based on the correction code,
wherein the memory cell is accessed by a pipeline operation, and the pipeline operation includes at least four pipeline stages including
a read cycle reading data from the memory cell,
an ECC cycle executing generation of the correction code or error detection for the memory cell in the ECC circuit,
a wait cycle during which processing for data related to the memory cell is not executed and
a write cycle writing data into the memory cell,
the pipeline operation during an operation of reading data from the memory cell is executed in order of the read cycle, the ECC cycle, the wait cycle, and the write cycle, and
the pipeline operation during an operation of writing data into the memory cell is executed in order of the read cycle, the wait cycle, the ECC cycle, and the write cycle.

4. The memory device according to claim 3, further comprising:
a sense amplifier that senses read data from the memory cell; and
a write driver that writes data to the memory cell,
wherein the sense amplifier operates in the read cycle in the at least four pipeline stages, and then the write driver operates in the write cycle in the at least four pipeline stages.

5. The memory device according to claim 1,
wherein the memory device is one of a magnetoresistive random access memory (MRAM), a resistive random access memory (ReRAM), and a phase change memory (PCM).

6. A memory device comprising:
a memory cell capable of holding data; and
an ECC circuit capable of generating a correction code and detecting an error based on the correction code,
wherein the memory cell is accessed by a pipeline operation, and the pipeline operation includes at least four pipeline stages including
a read cycle reading data from the memory cell,
an ECC cycle executing generation of the correction code or error detection for the memory cell in the ECC circuit,
a wait cycle during which processing of data related to the memory cell is not executed and
a write cycle writing data into the memory cell, wherein, during an operation of writing data into the memory cell, read data read from the memory cell in the read cycle is compared with write data received from an outside, and as a result of the comparison, when the read data is different from the write data, the write data is written into the memory cell.

7. The memory device according to claim 6, further comprising:

at least two or more address buffers, wherein the address buffers include a write address buffer capable of holding an address of the memory cell received from an outside during an operation of writing data, and a read address buffer capable of holding an address of the memory cell received from an outside during an operation of reading data.

8. The memory device according to claim 7, further comprising:

a write data buffer capable of holding write data into the memory cell;

a read data buffer capable of holding read data from the memory cell;

a first signal path capable of transferring data from the read data buffer to the write data buffer; and a second signal path capable of transferring data from the write data buffer to the read data buffer.

9. The memory device according to claim 6, wherein the pipeline operation during an operation of reading data from the memory cell is executed in order of the read cycle, the ECC cycle, the wait cycle, and the write cycle, and the pipeline operation during an operation of writing data into the memory cell is executed in order of the read cycle, the wait cycle, the ECC cycle, and the write cycle.

10. The memory device according to claim 9, further comprising:

a sense amplifier that senses read data from the memory cell; and a write driver that writes data to the memory cell, wherein the sense amplifier operates in the read cycle in the at least four pipeline stages, and then the write driver operates in the write cycle in the at least four pipeline stages.

11. The memory device according to claim 6, wherein the memory device is one of a magnetoresistive random access memory (MRAM), a resistive random access memory (ReRAM), and a phase change memory (PCM).

12. A memory device comprising:

a memory cell capable of holding data; and an ECC circuit capable of generating a correction code and detecting an error based on the correction code, wherein the memory cell is accessed by a pipeline operation, and the pipeline operation includes at least four pipeline stages including a read cycle reading data from the memory cell, an ECC cycle executing generation of the correction code or error detection for the memory cell in the ECC circuit, a wait cycle during which processing for data related to the memory cell is not executed and a write cycle writing data into the memory cell, and the number of pipeline stages in the pipeline operation is different between a data write operation and a data read operation into and from the memory cell.

13. The memory device according to claim 12, further comprising:

at least two or more address buffers, wherein the address buffers include a write address buffer capable of holding an address of the memory cell received from an outside during an operation of writing data, and a read address buffer capable of holding an address of the memory cell received from an outside during an operation of reading data.

14. The memory device according to claim 13, further comprising:

a write data buffer capable of holding write data into the memory cell;

a read data buffer capable of holding read data from the memory cell;

a first signal path capable of transferring data from the read data buffer to the write data buffer; and a second signal path capable of transferring data from the write data buffer to the read data buffer.

15. The memory device according to claim 12, wherein the pipeline operation during an operation of reading data from the memory cell includes at least four pipeline stages that are executed in order of the read cycle, the ECC cycle, the wait cycle, and the write cycle, the pipeline operation during an operation of writing data into the memory cell includes at least six pipeline stages that are executed in order of the read cycle, the wait cycle, the ECC cycle, the write cycle, a verify read cycle, and a write repair cycle, in the verify read cycle, data written in the memory cell in the write cycle is read and verified, and in the write repair cycle, data based on a verification result in the verify read cycle is written into the memory cell.

16. The memory device according to claim 15, further comprising:

a sense amplifier that senses read data from the memory cell; and a write driver that writes data to the memory cell, wherein the sense amplifier operates in the read cycle in the at least four pipeline stages, and then the write driver operates in the write cycle in the at least four pipeline stages.

17. The memory device according to claim 12, wherein the memory device is one of a magnetoresistive random access memory (MRAM), a resistive random access memory (ReRAM), and a phase change memory (PCM).

18. The memory device according to claim 3, wherein, when consecutively receiving a write instruction to write data into the memory cell and a read instruction to read data from the memory cell, the memory device outputs first data including write data received with the write instruction to an outside as read data corresponding to the read instruction.

19. The memory device according to claim 18, further comprising:

a write data buffer capable of holding write data into the memory cell;

a read data buffer capable of holding read data from the memory cell;

a first signal path capable of transferring data from the read data buffer to the write data buffer; and a second signal path capable of transferring data from the write data buffer to the read data buffer, wherein, when consecutively receiving the write instruction to write data into the memory cell and the read instruction to read data from the memory cell, the memory device causes the first data including write data received with the write instruction to be held in the write data buffer, causes second data read from the memory cell in the read cycle corresponding to the read instruction to be held in the read data buffer, transfers the first data to the read data buffer via the second signal path, and transfers the second data to the write data buffer via the first signal path.

20. The memory device according to claim 3, wherein the memory device is one of a magnetoresistive random access memory (MRAM), a resistive random access memory (ReRAM), and a phase change memory (PCM).

\* \* \* \* \*